United States Patent [19]

Nigam et al.

[11] Patent Number: 5,968,627
[45] Date of Patent: Oct. 19, 1999

[54] METAL FOIL DISK FOR HIGH AREAL DENSITY RECORDING IN ENVIRONMENTS OF HIGH MECHANICAL SHOCK

[75] Inventors: Anil Nigam, Saratoga; James W. White, Los Gatos, both of Calif.

[73] Assignee: Flextor, Inc., San Jose, Calif.

[21] Appl. No.: 09/007,452

[22] Filed: Jan. 15, 1998

[51] Int. Cl.⁶ ........................................... G11B 5/66
[52] U.S. Cl. .................. 428/65.3; 428/336; 428/692; 428/694 R; 428/694 T; 428/694 TS; 428/694 TM; 428/694 TC; 428/694 TR; 428/900; 360/97.01; 360/135; 204/192.2
[58] Field of Search .................. 428/694 R, 692, 428/694 T, 694 TS, 694 TM, 694 TC, 694 TR, 65.3, 900, 336; 204/192.2; 360/97.01, 135

[56] References Cited

U.S. PATENT DOCUMENTS

| | | | |
|---|---|---|---|
| 4,717,977 | 1/1988 | Brown | 360/98.07 |
| 4,739,427 | 4/1988 | Kilmer et al. | 360/98.07 |
| 4,745,031 | 5/1988 | Nakayama | 428/433 |
| 4,801,481 | 1/1989 | Sagoi et al. | 428/65.7 |
| 4,816,949 | 3/1989 | Yamada et al. | 360/120 |
| 4,876,137 | 10/1989 | Utsumi | 428/141 |
| 4,906,498 | 3/1990 | Ichikawa et al. | 428/65.1 |
| 4,960,636 | 10/1990 | Tomitaka et al. | 428/220 |
| 5,210,673 | 5/1993 | Ito | 360/135 |
| 5,480,695 | 1/1996 | Tenhover et al. | 428/65.5 |
| 5,480,733 | 1/1996 | Okumura et al. | 428/694 T |
| 5,492,745 | 2/1996 | Yokoyama | 428/65.3 |
| 5,496,632 | 3/1996 | Yamaguchi et al. | 428/332 |
| 5,523,173 | 6/1996 | Doerner et al. | 428/611 |
| 5,532,889 | 7/1996 | Stefansky et al. | 360/97.01 |
| 5,534,323 | 7/1996 | Chuujou et al. | 428/65.3 |
| 5,552,217 | 9/1996 | Yamaguchi et al. | 428/332 |
| 5,569,533 | 10/1996 | Lal et al. | 428/332 |
| 5,582,897 | 12/1996 | Kaneko et al. | 428/141 |
| 5,583,721 | 12/1996 | Kim | 360/97.01 |
| 5,604,030 | 2/1997 | Yamane et al. | 428/332 |
| 5,616,426 | 4/1997 | Tenhover et al. | 428/688 |
| 5,626,970 | 5/1997 | Hedgcoth | 428/611 |
| 5,643,649 | 7/1997 | Hagan et al. | 428/64.1 |
| 5,658,680 | 8/1997 | Shimizu et al. | 428/694 T |
| 5,665,478 | 9/1997 | Suzuki et al. | 428/611 |

*Primary Examiner*—Leszek Kiliman
*Attorney, Agent, or Firm*—Townsend and Townsend and Crew LLP

[57] ABSTRACT

The invention provides exemplary magnetic recording media, and in particular, flexible metal foil disks, read/write systems having such disks, and methods for making such disks. In one exemplary embodiment, a recording medium is provided which comprises a metallic substrate and at least one sputter deposited film of magnetic material on the substrate. The recording medium has a thickness that is less than about 0.010 inch and the substrate occupies at least 80% of the thickness. Further, the sputter deposited film is adapted to record and reproduce high areal densities of digital data. In one embodiment, such a recording medium is included in a read/write system to provide a unique recording interface that can resist mechanical shock.

44 Claims, 33 Drawing Sheets

METAL FOIL DISK FOR HIGH AREAL DENSITY RECORDING IN ENVIRONMENTS OF HIGH MECHANICAL SHOCK

BACKGROUND OF THE INVENTION

This invention relates generally to the field of data storage devices, and particularly to storage devices that attain both high areal recording density and high mechanical shock resistance. The data storage devices of the invention also have the benefits of mobility and of high-speed recording and retrieval of information, with a much lower consumption of power than required with a traditional hard disk drive (HDD).

Computing and communication platforms are changing and becoming more portable and mobile. The desktop personal computer and other systems such as file servers contain large databases that are not configured to be transportable. A number of devices are available to allow these platforms to communicate with each other, and to share information with mobile units. However, the speed at which data can be transmitted is limited by the bandwidth of these various alternatives. Communication over a telephone line or other hard-wired cable connection can attain impressive transfer speeds, but is not as convenient as a rotating memory device when the amount of information to be transmitted is large. For example a fast modem can transmit data at 53K bits/sec. and an ISDN connection can attain a speed of 128K bits/sec. Rotating memory devices currently operate at about 40,000K bits/sec. and this rate is continuing to improve with advancements in technology.

Newer applications such as digital cameras require a fast, low cost communication channel along with an archival function. Currently these products are designed to be tethered to a personal computer and transfer the images via a cable or utilize very expensive removable semiconductor flash memory cards. The digital images are then stored onto the rotating memory peripheral installed in the personal computer. This storage unit then performs the archival function.

There are generally two types of rotating memory devices. One utilizes a storage medium that is secured and cannot be removed from the device, such as the HDD. The second type utilizes a recording medium that is removable and interchangeable with other similar units, such as a floppy disk drive (FDD). The FDD has the benefit of being the least expensive and most rugged removable medium, while the HDD is typically secured to the desktop computer or organized as a non-transportable disk array in a file server. There are designs that mount a HDD in a drawer that will allow the entire assembly to be exchangeable between various platforms. There are also designs that allow a single hard disk (HD) or a dual hard disk pack contained in a plastic enclosure (cartridge) to be removed and interchanged with another similar disk drive. However, the robustness and reliability of the respective head/disk interface limits the usefulness of these devices.

Hence, it is one objective of the invention to provide a unique recording interface that can resist mechanical shock, that does not compromise storage capacity, data accessing speed or reliability, and which does not increase the production cost of the storage subsystem.

HDD recording heads comprise a recording element or transducer that is mounted at or near the trailing edge of a ceramic body. The ceramic body (slider) is supported by a gimbal arrangement over a thick aluminum or glass disk substrate. During operation, the slider floats on a thin film of air over the spinning disk surface. This film of air provides an air bearing effect, as described in U.S. Pat. Nos. 4,673,996 and 4,870,519, the disclosures of which are herein incorporated by reference. The applied load of the gimbal balances the forces generated in the air bearing film, resulting ideally in a condition of non-contact between slider and disk during full speed disk rotation.

Rigid disks, in use today, range in thickness from about 0.015 inches (15 mils) to about 0.035 inches (35 mils). The slimmer 15 mil thick disks have a smaller outside diameter of about 2.0 inches. The rigid disk presently manufactured in the largest volume has an outside diameter of 3.74 inch (95 mm) and is constructed utilizing a 30 mil thick substrate. These disks operate at speeds of about 4,000 rpm to as high as 10,000 rpm. The spindle motors in these drives consume considerable power as they must accelerate these disks from a stationary position up to operating speeds, and maintain this speed during the record and reproduce operation.

The details of the recording layers on a typical prior art rigid disk 10 are shown in FIG. 1 and consist, first, of a layer of nickel-phosphorous 14 which is plated onto a polished aluminum or glass substrate 12. The entire disk is then polished, and cleaned to attain a smooth surface. A film of chromium 16 is then sputter deposited to a thickness of about 500 Å. A sputter deposition of a magnetic film 18 follows, containing mostly cobalt with certain other elements in small concentrations, with a thickness of approximately 400 Å. The final operation covers the disk with a thin layer of carbon 20 to provide corrosion resistance. The equipment and procedures that deposit these films have been well researched and developed and are being utilized in the manufacture of HDs in very large volumes. All the sputtering operations occur in a vacuum chamber at elevated temperatures of about 250° C. to 300° C. Finally, a topical lubricant is applied to the disk surface that will allow the recording heads to start and stop in contact with the disk surface.

There are certain recording transducer designs that allow a portion of the trailing edge of the recording head slider to drag on the disk surface. The head contact force is kept sufficiently small so as not to wear-off the recording film or damage the recording element. Most HDDs utilize non-contact recording heads which typically maintain a head to disk separation distance of about two micro-inches at the trailing edge of the slider body.

HDD designs require that the recording components be maintained in a clean environment. The magnetic layer on the disk is thin to attain high linear bit density, and the distance between the magnetic film and the recording transducer element is kept small, on the order of two micro-inches. Any contact due to mechanical shock or other disturbance will result in two hard surfaces, namely, the ceramic recording head and the metal disk, impacting each other, creating a local defect or a scratch. Very large shocks can result in catastrophic contact between these surfaces and the generation of wear particles. These particles and the resulting damage to slider and disk surface topography could then restrict the head from ever recovering to its non-contact operating condition. Situations such as these result in reliability problems and the loss of recorded data.

The HDD includes a metallic or glass substrate that is chosen for its isotropic characteristics. The data tracks on the disk are laid out as concentric circles. There is a small-unrecorded band that separates each data track. The width of this band is kept small to maximize the written track width. Typical hard drives currently attain track densities of about 4,800 to 8,000 tracks per inch. A servo system is designed to keep the recording head aligned to the center of the data track and not have it deviate in position by more than 10% of the written track width, resulting in reliable recovery of the recorded information.

Floppy disk drives (FDD) are designed to operate in unsealed environments. The floppy disk is composed of a plastic substrate, such as Mylar, which is coated with a slurry of magnetic particles. FDDs operate at low speeds (typically less than 1000 rpm) with the recording heads sliding on the recording medium. To attain good wear characteristics the magnetic slurry contains a binder and bulk lubricant along with the magnetic particles. This coating process cannot support the same areal density of magnetic recording as sputter deposited films on HDDs. The plastic substrate cannot survive the high temperatures typically required by sputter deposition processes, and consequently, alternative techniques such as vapor deposition and low temperature sputtering have been studied. To date, these techniques have resulted in films with magnetic characteristics that are not significantly better than those of the web/slurry coating process.

There are designs that allow floppy media to operate at high disk speeds, whereby, the flexibility of the disk is utilized to attain certain beneficial characteristics. One such characteristic allows the recording element to fly close to the disk surface, while other portions of the recording head are maintained at higher distances for acceptable reliability in unsealed environments. For example, one such system is described in U.S. Pat. No. 5,675,452, the complete disclosure of which is herein incorporated by reference.

Other methods have utilized standard HDD heads arranged in an opposed configuration on either side of the floppy disk. At high speed, a non-contact condition can be maintained in this arrangement. However, this design relies upon the durability of the floppy media to overcome inevitable tolerance mismatches between the exact location and gimbal conditions of the opposing recording head assemblies. Conditions such as these would result in intermittent contact between the floppy disk and the recording heads.

Another technique utilized a backing plate positioned in close proximity to a spinning floppy disk. The backing plate provided some rigidity to the flexible disk, whereby, a recording head could be penetrated from one side of the disk to attain a non-contact head/disk interface. However, this method can only offer single sided recording.

Magnetic films developed by the web coating process, such as floppy disks, have lower bulk magnetic characteristics and the signal to noise ratio is poorer than that of sputter deposited HDs. Dual coated media such as Fuji's ATOMM floppy disk and vapor deposited media such as Sony's ME also have coating thickness and bulk magnetic characteristics that are quite inferior to HDs. As discussed earlier, floppy product designs require the disk substrate to be compliant, and a plastic film such as Mylar or PET (polyethylene terephthalate) has been successfully used in such applications. These films exhibit anisotropic expansion characteristics, and the servo system of the disk drive has to be designed to correct off-track errors that have frequency components located at twice the rotational speed. Removal and re-installation of the diskette in the disk drive results in disk centering error, whereby, the center of the data tracks recorded on the disk becomes displaced from the center of rotation of the spindle motor. A stationary recording head under these circumstances will see the center of each data track move between two extreme positions during each revolution. The frequency of this movement is at the spindle rotational rate. Anisotropy in the floppy disks causes the data tracks to distort due to changing environmental conditions, and a circular track recorded under one set of environmental conditions can become elliptically shaped under different environmental conditions. A stationary recording head will see the center of the data tracks move between two extreme positions twice in each revolution of the disk, or at a frequency that is two times the spindle rotational rate. The servo control system must correct these positioning errors and must be designed with a much wider band-width than a HDD operating at a similar track density.

In summary, floppy disks have magnetic coatings that have lower signal strength than HDs, requiring a much wider track to attain similar read-back amplitudes. The base material exhibits anisotropic expansions necessitating more stringent servo control. Due to these limitations, a much smaller track density must be utilized in these products. Consequently, it is extremely difficult to develop high storage density, high shock resistant, low power consuming recording apparatus with a floppy disk.

It is therefore an object of the invention to provide a rotating data storage medium which is generally flexible while still providing many of the storage capacity benefits in existing HDDs. In particular, it is an object to provide a flexible data storage medium which is capable of recording and reproducing high areal densities of digital data.

SUMMARY OF THE INVENTION

The invention provides exemplary magnetic recording media, and in particular metal foil disks, also referred to as flexible metal disks, read/write systems having such disks, and methods making such disks. In one exemplary embodiment, a recording medium is provided which comprises a metallic substrate and at least one sputter deposited film of magnetic material on the substrate or on an intermediate material which is on the substrate. The recording medium has a thickness that is less than about 0.010 inch and the substrate occupies at least 80% of the thickness. Further, the sputter deposited film is adapted to record and reproduce high areal densities of digital data.

A variety of materials may be employed to construct the substrate including nickel, nickel alloys, steel, stainless steel, Sandvik steel, beryllium, beryllium alloys, copper, copper alloys, brass, brass alloys, bronze alloys, titanium, titanium alloys, aluminum, aluminum alloys, and the like. Preferably, the thickness of the flexible metal disk is in the range from about 0.0001 inch to about 0.010 inch, more preferably from about 0.0001 inch to about 0.005 inch, and still more preferably from about 0.0001 inch to about 0.002 inch. However, it will be appreciated that the particular thickness of the substrate will depend on the material used to construct the substrate.

In one aspect, a layer of chromium, alone or in combination with other metals, is deposited between the substrate and the layer of magnetic film. Alternatively, other materials, such as platinum and its alloys, may be deposited between the substrate and the magnetic film in order to obtain a more optimum crystalline structure of the magnetic material. In another aspect, the magnetic film comprises cobalt or another magnetic material. In still another aspect, a layer of protective film, such as carbon, is deposited on the layer of magnetic film.

In another embodiment, the invention provides a recording medium consisting essentially of a metallic substrate, a layer of chromium, a film of magnetic material deposited on the layer of chromium, and a layer of protective film deposited on the film of magnetic material.

The invention further provides an exemplary method for making a recording medium. According to the method, a metallic substrate is provided having a thickness that is less than about 0.008 inch. A layer of a magnetic material is sputter deposited on the metallic substrate or on an intermediate material which is on the substrate. Further, a protective film is sputter deposited over the layer of magnetic material such that the total thickness of the medium is less than about 0.010 inch.

Preferably, a metallic layer, such as chromium, platinum, or the like is sputter deposited on the substrate prior to depositing the film of magnetic material on the substrate and functions as the intermediate material. In one preferable aspect, the substrate is selected from the group of consisting of nickel, nickel alloys, steel, stainless steel, Sandvik steel, beryllium, beryllium alloys, copper, copper alloys, brass, brass alloys, bronze alloys, titanium, titanium alloys, aluminum, and aluminum alloys. In still another aspect, the thickness of the medium is less than about 0.005 inch, and more preferably less than about 0.002 inch.

The invention still further provides a system for reading and recording digital information. The system comprises a flexible metallic disk having a first side and a second side. The disk comprises a metallic substrate and at least one sputter deposited film of magnetic material. The disk has a thickness that is less than about 0.010 inch and the substrate occupies at least 80% of the thickness. Further, the sputter deposited film is adapted to record and reproduce high areal densities of digital data. The system further includes a first slider having a gas bearing surface positioned toward the first side of the disk, and a second slider having a gas bearing surface positioned toward the second side of the disk. At least one of the sliders houses at least one read and/or write transducer. A mounting system is further provided to mount the second slider relative to the disk substantially opposite of the first slider and to urge the second slider toward the disk such that the second slider is movable toward and away from the disk. In this way, the flexible metallic disk and the sliders experience an increased ability to avoid impacting each other, as compared to the head/disk interface of a hard disk drive, when exposed to mechanical shock. Further, the flexible metallic disk and the sliders experience an increased ability to avoid impacting each other, as compared to the head/disk interface of a floppy disk drive, when exposed to high speed track-to-track access motion.

In one aspect, the metallic substrate is disposed between two sputter deposited films of a magnetic material. In another aspect, the mounting system provides at least one rotational degree of freedom to the first slider relative to the plane of the disk. In still another aspect, the substrate is selected from the group of substrates consisting of nickel, nickel alloys, steel, stainless steel, Sandvik steel, beryllium, beryllium alloys, copper, copper alloys, brass, brass alloys, bronze alloys, titanium, titanium alloys, aluminum, and aluminum alloys. Preferably, the thickness of the flexible metal disk is less than about 0.005 inches and more preferably less than about 0.002 inch.

In yet another aspect, a layer of chromium is deposited between the substrate and the layer of magnetic film. In one aspect, the magnetic film comprises cobalt. In another aspect, a layer of protective film, such as carbon, is deposited on the layer of magnetic film.

DETAILED DESCRIPTION OF THE SPECIFIC EMBODIMENTS

The invention provides exemplary magnetic recording media, and in particular, metal foil disks, also referred to as flexible metal disks, read/write systems having such disks, and methods for making such disks. The disks of the invention are preferably constructed from a relatively thin metallic substrate or foil so that the resulting disk is generally flexible. Preferably, the metal foil is thin enough so that the total thickness of the disk is less than about 0.010 inch. Further, the substrate preferably occupies at least 80%, and more preferably at least 90%, of the thickness of the disk.

Preferably, the disk will have a thickness that is in the range from about 0.0001 inch to about 0.010 inch, more preferably from about 0.0001 inch to about 0.005 inch, and still more preferably from about 0.0001 inch to about 0.002 inch. It will be appreciated that the particular thickness of the substrate will depend upon a variety of factors including the material properties of the materials used to construct the substrate. For instance, a variety of materials may be employed to construct the substrate including nickel, nickel alloys, steel, stainless steel, Sandvik steel, beryllium, beryllium alloys, copper, copper alloys, brass, brass alloys, bronze alloys, titanium, titanium alloys, aluminum, aluminum alloys, and the like.

Figure 1:
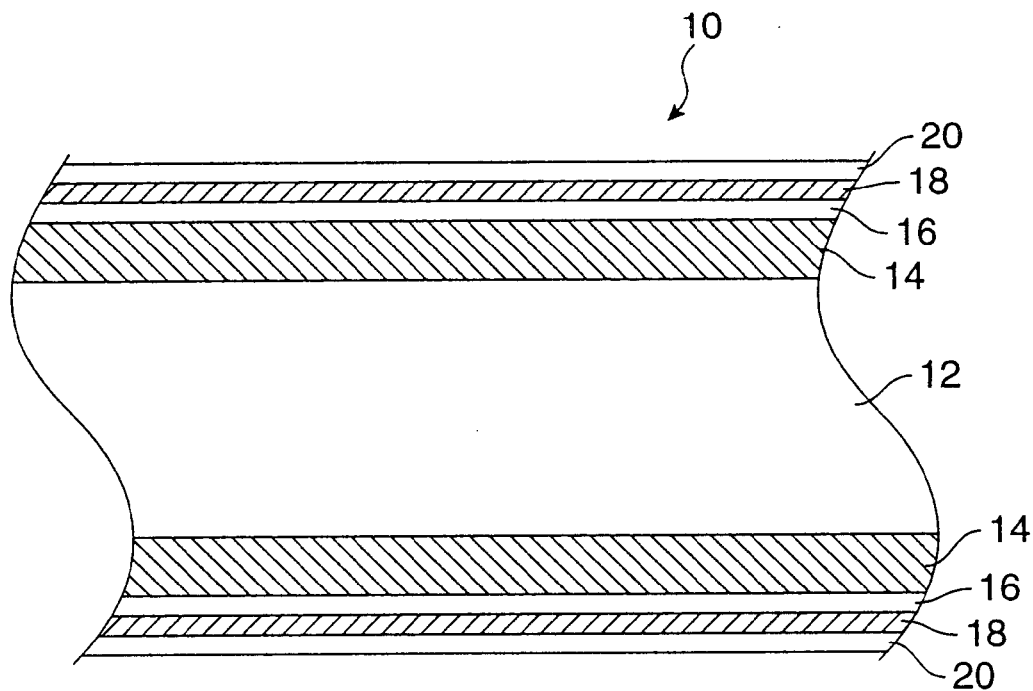
FIG. 1 is a partial cross sectional side view of a prior art rigid recording disk.
Figure 2:
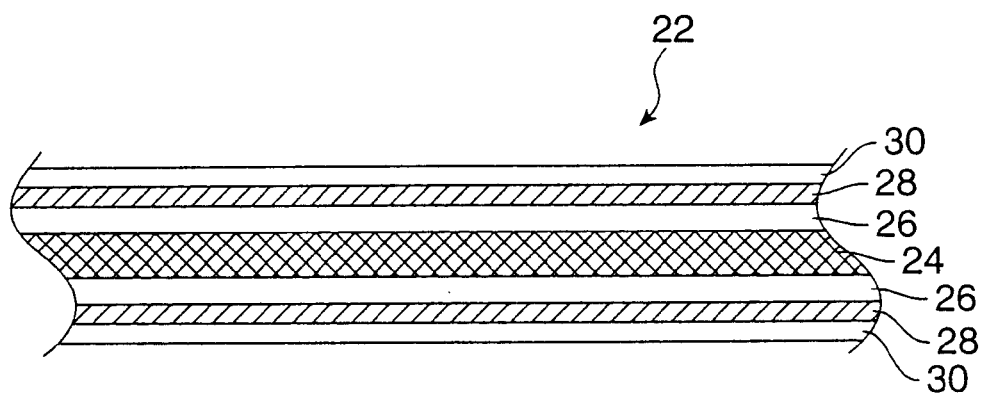
FIG. 2 is a partial cross sectional side view of an exemplary flexible recording disk according to the invention.

In a preferred embodiment as illustrated in FIG. 2, a flexible recording disk 22 is constructed utilizing a 0.001 inch (one mil) thick sheet 24 of Nickel 600 that is in a full-hard condition. Nickel 600 is an alloy, composed of approximately 76% nickel, 15.5% chromium and 8% iron. The Nickel 600 sheet is first placed in a sputtering machine and a layer of chromium 26 is sputter deposited to a thickness of 500 Å, followed by a sputter deposited layer of a magnetic material 28, such as cobalt, to a thickness of 400 Å. Materials other than chromium, such as platinum or platinum alloys, can also be used in order to obtain a more optimum crystalline structure in the magnetic layer. Further, magnetic materials other than cobalt can also used be used. For instance, the magnetic coercivity and squareness of the recorded signal may be improved by selection of a magnetic film material other than cobalt or by the use of a cobalt based alloy. The cobalt layer 28 is magnetic and susceptible to corrosion. To protect layer 28 a film, approximately 50 Å to 100 Å thick, of carbon 30 is sputter deposited to entirely cover the magnetic layer 28. Disk 22 may then be utilized in data storage products to record and reproduce information.

Figure 3:
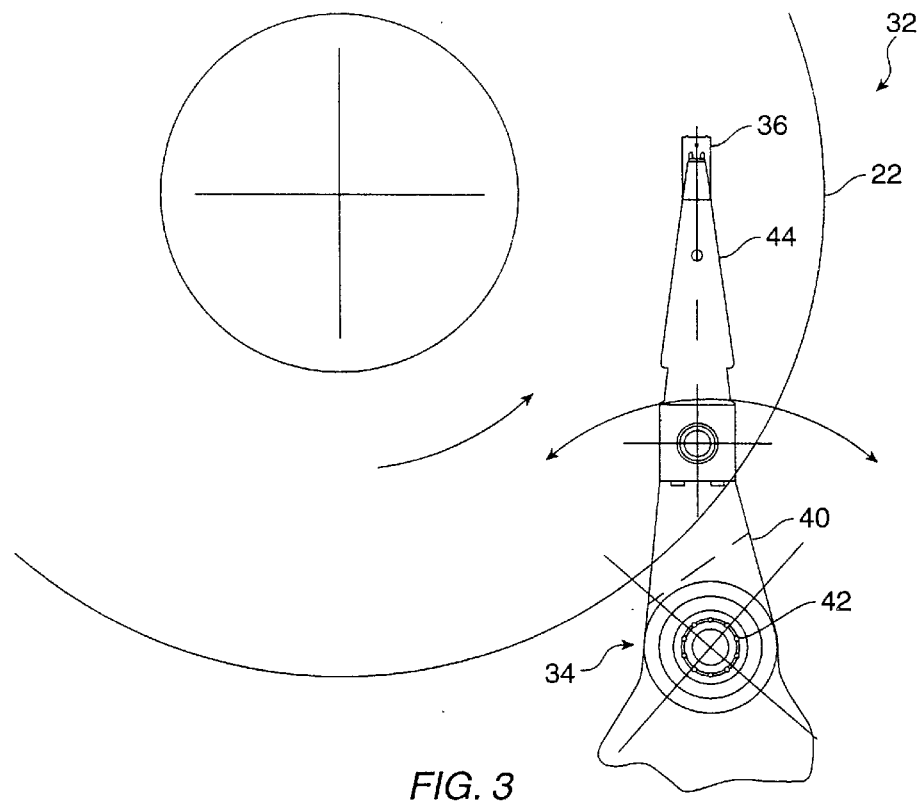
FIG. 3 illustrates an exemplary data storage apparatus for transferring data to or from the disk of FIG. 2.
Figure 4:
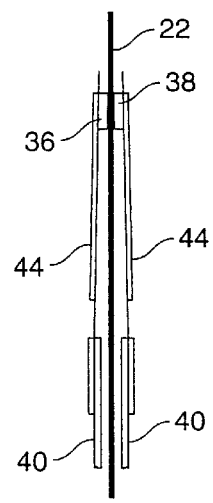
FIG. 4 is a partial side view of the apparatus of FIG. 3.
Figure 5:
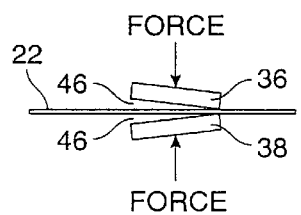
FIG. 5 is a schematic illustration of the forces applied by a pair of gimbals to a pair of recording heads when operating the apparatus of FIG. 3.
Figure 6:
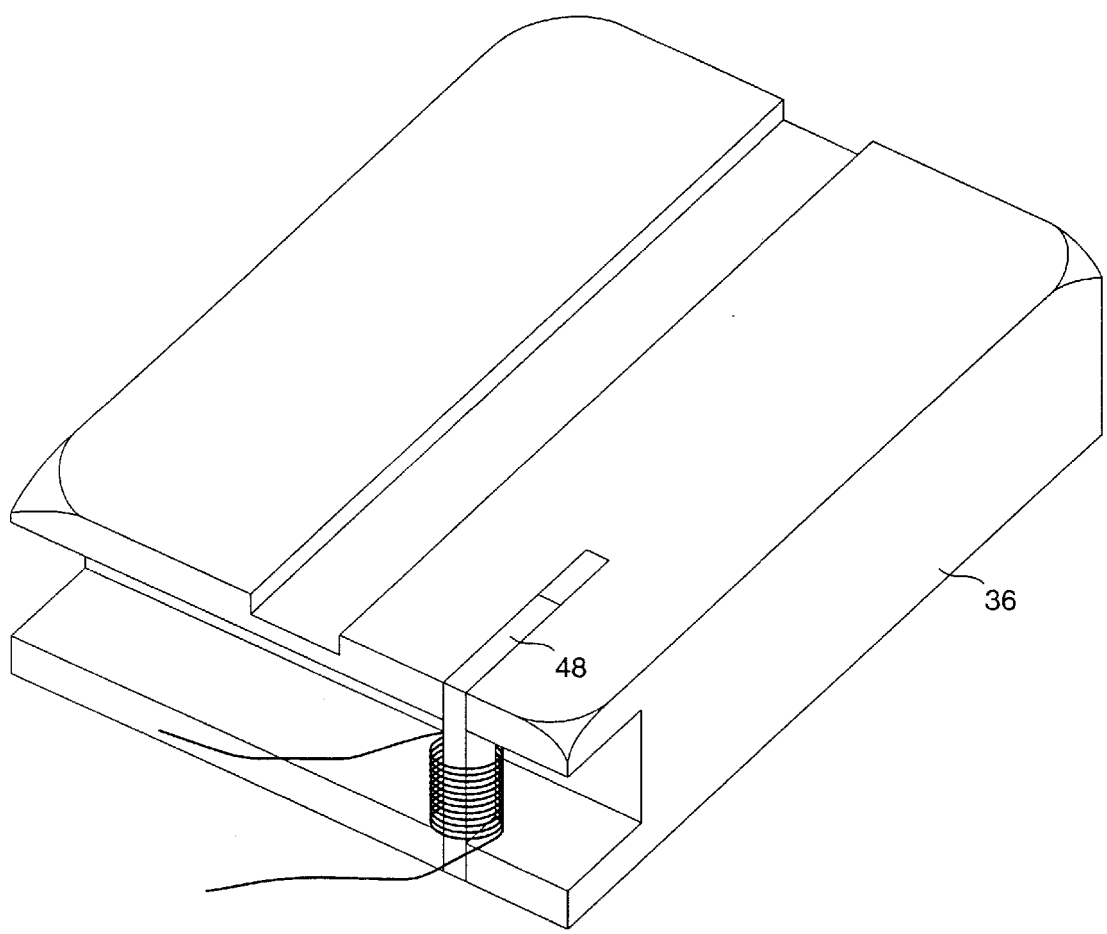
FIG. 6 is a perspective view of an exemplary recording head of the apparatus of FIG. 3.

FIG. 3 illustrates a data storage apparatus 32 that employs a rotary actuator 34. Disk 22 is mounted to a spindle motor (not shown) that rotates disk 22 at a speed of approximately 4800 rpm. Apparatus 32 further includes recording heads 36, 38 (see FIG. 4) that are attached to a pair of arms 40 that in turn are supported by a ball bearing arrangement movable about a pivot point 42. Heads 36, 38 are gimbal mounted and each have vertical translation, as well as roll and pitch rotational degrees of freedom. The heads 36, 38 are industry standard two rail sliders as shown in FIG. 6 and are arranged on opposing sides of the disk 22 as shown in FIG. 4. FIG. 5 depicts the forces applied by a pair of gimbals 44 (see FIGS. 3 and 4) to the recording heads 36, 38 and an air bearing film 46 created between these heads and the respective disk surface. A magnetic transducer 48 is mounted to the trailing edge of each of the heads 36, 38 where it can maintain a small separation distance with the disk surface as shown in FIG. 6. In the configuration shown in FIG. 5, the dimensions of the recording head rails and the magnitude of the applied load are designed to develop a spacing of approximately 2 micro-inches between magnetic transducer 48 and disk 22.

The areal density of the information that can be recorded on disk 22 is directly related to the number of data tracks, the properties of the magnetic film on disk 22, the separation distance between the recording element and this film, the magnetic properties of the materials used to fabricate the transducer element, and its gap length.

Given the characteristics of an isolated pulse one can establish the linear bit density, i.e. the number of magnetic bits recorded over a unit length. of particular interest is a parameter called $PW_{50}$, that defines the width of an isolated pulse at its 50% amplitude level. This can be estimated by the following expression, $$PW_{50} = \sqrt{(g^2 + 4(d+a)*(d+a+t))}$$

Where,
g=gap length of the recording element
d=distance of this gap from the magnetic layer
t=thickness of the magnetic layer $$a = \sqrt{(M_r t*(d+0.5t)/H_c)}$$

$M_r$=remanent magnetism of the magnetic layer
$H_c$=coercivity of the magnetic layer The magnetic layer on the flexible disks of the invention are created by vacuum sputtering operations and is generally homogeneous. These operations are performed at elevated temperatures of approximately 250° C. in order to allow the crystallographic structures to develop in the respective films. Nickel is very stable at elevated temperatures. Prior art flexible disks are made from plastic substrates such as Mylar and PET. Such prior art flexible films cannot survive such high temperatures and instead are coated with magnetic materials in a web process. The magnetic particles of the coating are combined to form a slurry with binders and other additives. This slurry is then applied as paint onto the plastic film. The concentration of magnetic materials in the resulting prior art film is much lower and coating thickness is much larger, approximately 2200 Å, than that of the present invention. Furthermore, the film thickness of the prior art flexible disks can vary over the disk surface.

The above expressions demonstrate that, for the same transducer to disk spacing, d, and media coercivity value, $H_c$, a thin magnetic film with a small $M_r t$ product will produce the smallest transition width, a, and $PW_{50}$ value. The smaller these two parameters, the larger the number of bits that can be recorded per unit length on the magnetic film.

High coercivity plastic coated disks utilize metal particles. These particles are susceptible to corrosion and need to be individually coated with an inert layer. The coating increases the size of the particles, resulting in a lower concentration of magnetic material in the resulting film. The number of magnetic particles is directly related to the read back signal amplitude, while the presence of binders and additives results in noise creating a system with a poor signal-to-noise ratio.

In contrast, the flexible metal disks of the invention have a 50 Å to 75 Å thick non-magnetic layer for corrosion resistance. This increases the transducer to magnetic film spacing, and thereby, increases the $PW_{50}$ value. However, the improved signal-to-noise ratio due to the purity of the magnetic film compensates for the larger $PW_{50}$ value, resulting in improved overall performance. Additionally, the films of the invention are formed by controlled operations which produce very thin films, e.g., 250 Å to 400 Å, compared to 2200 Å to 4000 Å for prior art disks. The trend in the sputtering industry is to attain even thinner layers. These trends will continue to enhance the performance of the flexible metallic disks of the invention.

Another item controlling areal recording density is the number of data tracks that can be developed on the disk surface. The state of the art in transducer element fabrication is to sputter deposit the core structure, which is either a magneto-resistive element or a longitudinal recording element with an air gap. Very small core widths have been successfully fabricated in these structures. The limiting parameters are the accuracy attainable by the servo control system and the strength of the read back signal. The $M_r$ value of the respective film is directly related to the magnitude of the read back signal, while the track density is inversely related to the signal output. The smaller the written track width, i.e. the larger the track density, the more accurately the servo system has to position the transducer in the recording head on the recorded track.

HDs currently attain large track densities of 5,500 to 8,500 tracks per inch. Flexible disks fabricated with plastic substrates have anisotropic expansion/contraction characteristics. This anisotropy is due to the variability in the orientation of the long chain molecules forming the substrate. Mechanical dimensions in the film are influenced by temperature and humidity in disproportionate ways around the circumference of the disk. A perfectly circular track after temperature and humidity changes could distort into the approximate shape of an ellipse. The servo control system preferably provide corrections at the rotational speed, e.g., 80 Hz, and at two times the rotational speed, e.g., 160 Hz.

Because of such issues, track densities employed in products developed with flexible, plastic media are about ½ to ⅓ lower than traditional HD storage devices. The metal foil disk of the invention has a well defined crystalline structure which expands and contracts equally along all axes. Thus, the metal foil disk of the invention contains data tracks that remain circular after temperature and/or humidity changes. Products that utilize these disks can operate at HD track densities and utilize servo control technology as implemented in existing HDDs.

Figure 7:
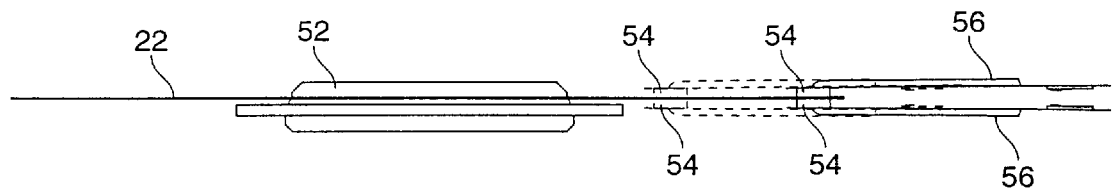
FIGS. 7 and 8 illustrate a linear actuator configuration for use with the disk of FIG. 2.
Figure 8:
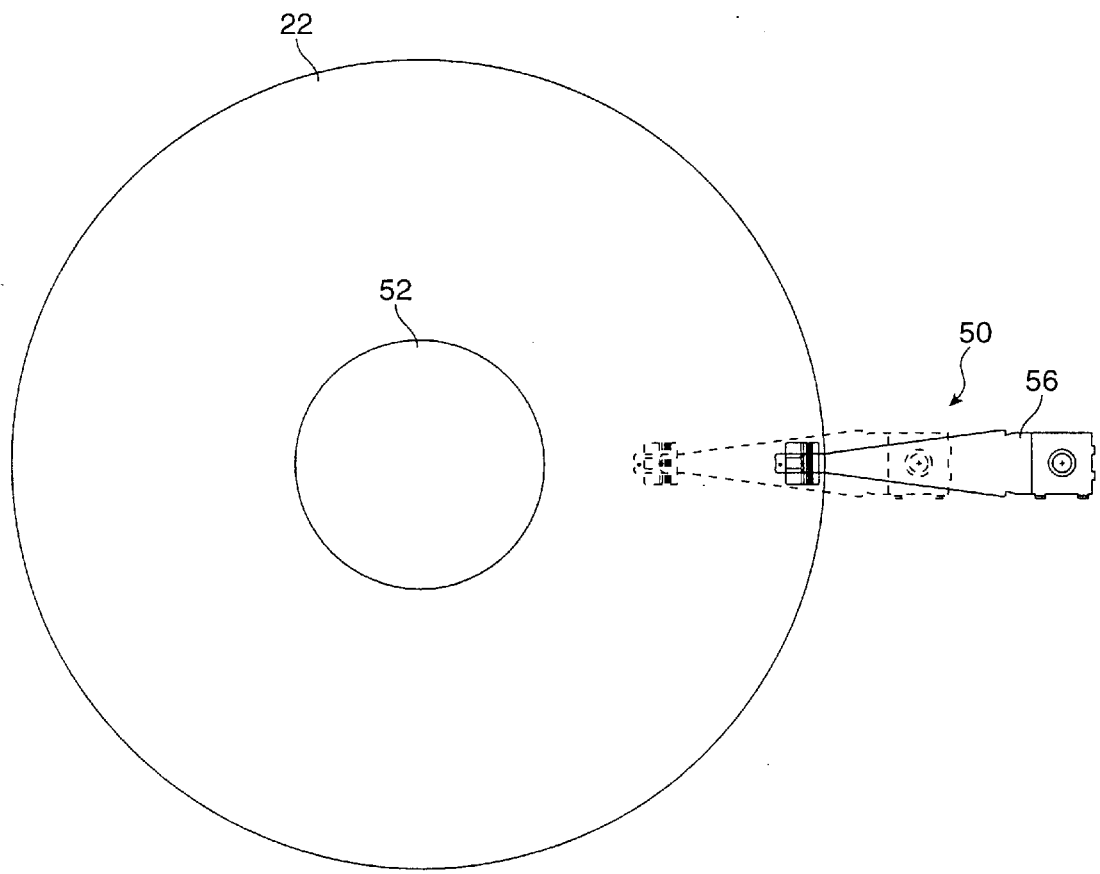

FIGS. 7 and 8 illustrate a linear actuator 50 configuration for use with flexible, metal disk 22. FIG. 7 is the end view of the assembly, while FIG. 8 is the plan view. Disk 22 is supported by a spindle motor 52, and heads 54 are attached to gimbals 56. Heads 54 are arranged in an opposed configuration. Gimbals 56 are attached to an actuation system (not shown) that moves the heads 54 along a line, which could be a radial line, or a line that is parallel and offset from it. Further, gimbals 56 provide heads 54 with vertical translation, as well as pitch and roll rotational degrees of freedom. This arrangement is particularly useful in removable volume data storage apparatus to maintain compatibility with older generation media, such as the 3.5 inch 1.44 MB floppy diskette. In the specific example of a product that would read and write information to a 3.5 inch 1.44 MB diskette, the recording head addressing these tracks preferably operates on a line that is approximately 0.014 inches offset from and parallel to the radial line.

Figure 9:
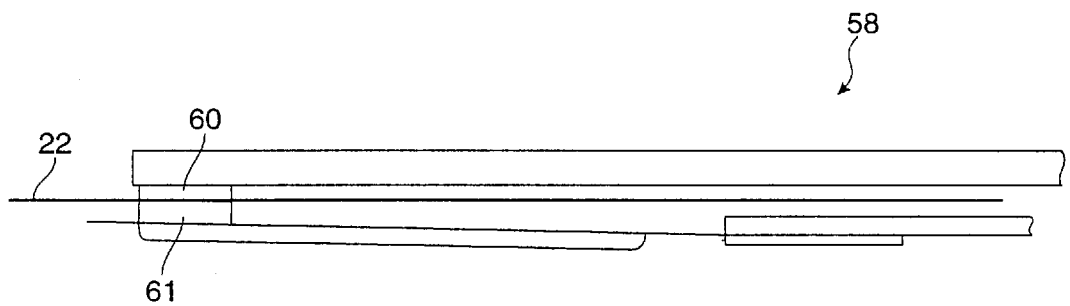
FIG. 9 illustrates another actuator configuration for use with the disk of FIG. 2.
Figure 10:
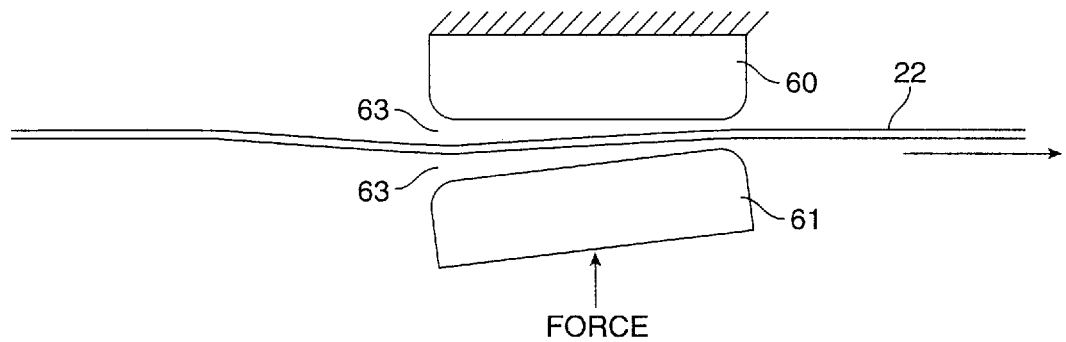
FIG. 10 is a schematic illustration of a force applied by a gimbal to a recording head when operating the configuration of FIG. 9.

FIGS. 9 and 10 depict another actuator 58 coupled to a pair of heads 60, 61. Head 60 is restricted from any excursion that is perpendicular to the surface of disk 22. Head 60 can, however, experience pitch and roll motion. The opposing head 61 is gimbal mounted and has all three degrees of freedom, namely, excursion perpendicular to the disk surface (i.e. a vertical degree of freedom), pitch and roll. In this arrangement the head 61 with the three degrees of freedom is utilized to urge the flexible disk 22 towards the other head 60. Air bearing films 63 develop between disk 22 and each of the two head air bearing surfaces. Disk 22 takes on a non-contact equilibrium position between heads 60 and 61 for reliable recording and reproduction of information. This particular configuration can attain greater stiffness along the axis that is perpendicular to the disk surface. This additional stiffness can be beneficial in creating products with high shock resistance.

The flexible, metal disk of the invention has cost advantages compared to a HD. A HD is typically manufactured from aluminum sheets that are cut into disks. These disks are polished and then plated with a thin film of nickel-phosphorus. Each disk is individually handled through the entire process. Once the disk substrate size has been established, it cannot economically be reconfigured for another size application. For example, a 3.5 inch disk once fabricated cannot be economically modified for use in a sub 3.5-inch data storage device. The cost of a HD that is nickel-plated and polished is approximately $2.50. The vacuum sputtering operations and handling result in additional costs, and a finished HD, in large quantities, is priced at about $7.50.

In the embodiment of FIG. 2, disk 22 is fabricated from a sheet of nickel. As such, there is no need for an aluminum substrate base or a nickel plating operation. Nickel sheets are priced at approximately $30 per pound and can be delivered as a roll. The standard 3.5-inch floppy disk diameter is 3.378 inch and weighs 0.0025 pounds. Hence, a nickel sheet with these dimensions would cost approximately 8 cents. This cost, however, may be higher in a manufacturing environment where the cost of scrape and blanking would need to be added to the basic material cost.

Figure 11:
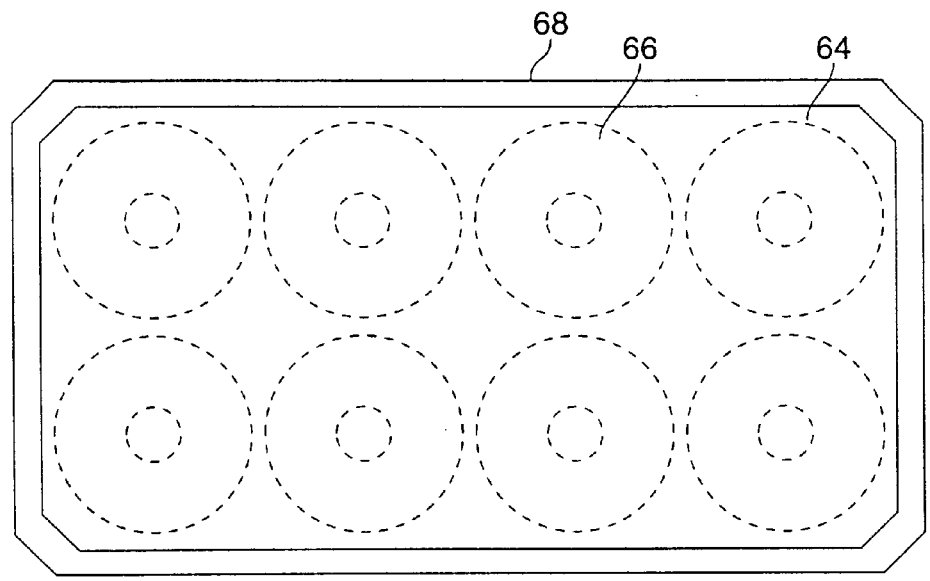
FIG. 11 illustrates a sheet of nickel which is to be blanked into disk.

It is possible to configure a sputtering operation where a sheet of nickel 64, as shown in FIG. 11, is placed in a sputtering machine and the respective films deposited. Sheet 64 can then be blanked into disks 66 as required. The expense of sputtering, polishing, handling and cleaning may be amortized over all the disks fabricated from this sheet resulting in lower product cost. Furthermore, for smaller disk diameters more disks can be fabricated from the same sheet, attaining an even lower cost.

The sputtering operation discussed above requires the nickel sheet to be handled in special vacuum chambers. Sheet 64 is heated to the appropriate temperature and then processed in a manner similar to the HD. In one arrangement, nickel sheet 64 is stretched over a frame 68 to build tension in sheet 64. This tension provides rigidity to sheet 64 allowing it to be handled during the polishing and the cleaning operations. The use of the frame 68 can be continued in the sputtering chambers. Individual disks are stamped from this sheet after all the processing has been completed.

Figure 12:
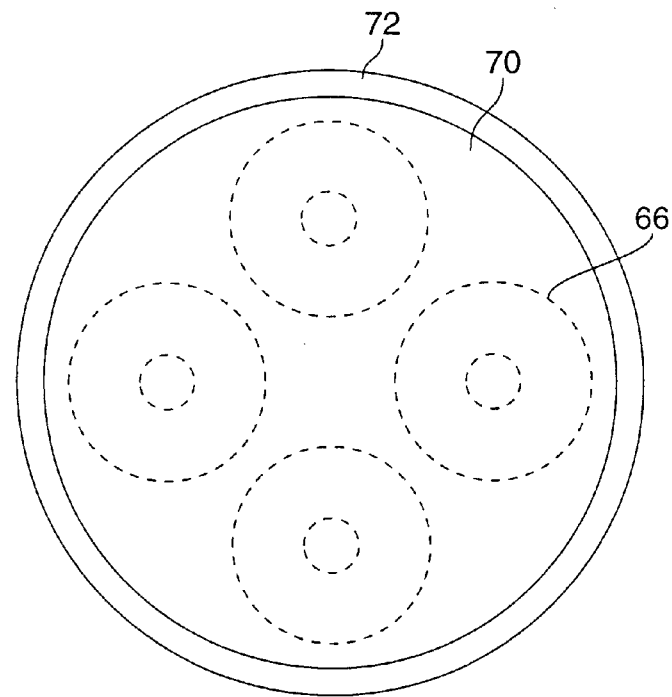
FIG. 12 illustrates a circular sheet of nickel which is to be blanked into disks.
Figure 13:
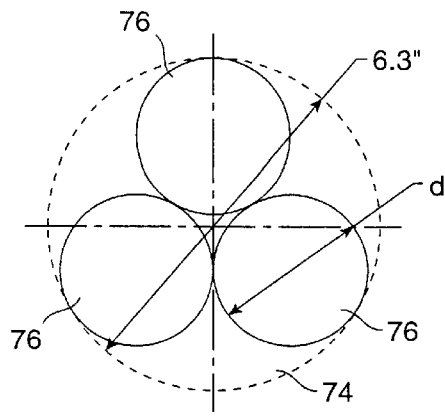
FIGS. 13, 14 and 15 depict alternative circular configurations of targets which are to be blanked into disks.
Figure 14:
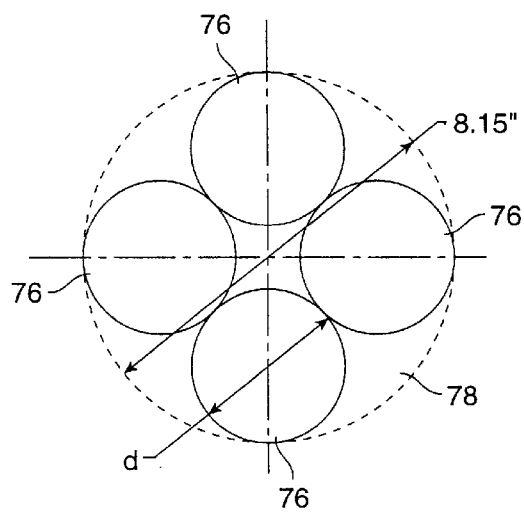
Figure 15:
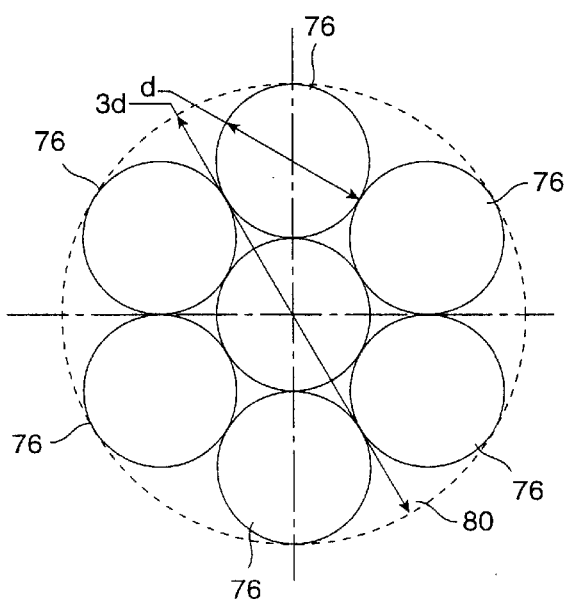

There may be additional efficiencies in having a circular target 70 and a circular frame 72, such as more uniform coverage of the substrate in the vacuum sputtering operation, as shown in FIG. 12. FIGS. 13, 14 and 15 depict alternative circular configurations. Using the example of a 3.5-inch floppy disk, the diameter of a target 74 illustrated in FIG. 13 is 6.3 inches, resulting in a bare material cost of 10 cents per disk 76. The diameter of a target 78 illustrated in FIG. 14 for the same disk 76 is 8.15 inches resulting in a material cost per disk of 12 cents per disk. For disk 76 in a target 80 of FIG. 15, the material cost is about 11 cents per disk. The cost of the sputtering machine may be higher for larger target diameters, particularly those depicted in FIGS. 14 and 15. However, these configurations yield more disks and there may be other economies from the cleaning and blanking operations that could offset the higher capital cost of the sputtering operation.

The preferred embodiment of FIG. 2 describes a flexible disk 22 constructed from an alloy of nickel. However, such metals as 316 stainless steel, beryllium copper, brass, 13RM19 Sandvik steel, titanium, aluminum, as well as other metals and metal alloys can also be utilized. Sheet thickness can also be varied to suit the specific application. The preferred embodiment of FIG. 2 illustrates a 0.001 inch (1 mil) thick sheet of nickel. Other thicknesses can be fabricated in a similar manner. One reason to consider a different thickness is that a sheet with thickness of approximately 0.005 inch (5 mils) is easier to handle. With regard to power consumption, the flexible metal disk with a very small thickness has the lowest inertia and thus the lowest load on the spindle motor. As such, the spindle motor will consume less power. A typical HD installed in 3.5-inch disk drives has a weight of 0.03 pounds and an inertia of about $4.45 \times 10^{-5}$ pounds-second$^2$-inch$^4$. The nickel disk 22 of the preferred embodiment with the same mechanical dimensions has a weight of about $3 \times 10^{-3}$ pounds and an inertia of about $1.5 \times 10^{-7}$ pounds-second$^2$-inch$^4$. The mass is one order of magnitude lower and the inertia is two full orders of magnitude lower than the corresponding HD. These characteristics of the flexible metal disk result in faster spin-up times during disk start-up, utilizing the same spindle motor and a lower power consumption rating.

Hence, with the flexible metal disk of the invention, it is now possible to develop data storage products that have the same areal recording density and high speed recording performance as HDs, but consume less power. These products can also be configured to spin down during idle periods and then start-up when required. HD storage products typically implement an idle speed operating environment, where the rotational speed during idle is lower than the operational speed, and is just sufficient to keep the heads flying over the disk surfaces. The objective is to overcome the rather long time period for the disk to attain an operational condition from a stopped state. A storage device with the flexible metal disk of the invention can be implemented with only two states: "on", operating at the designated speed, and "off" where the motor is not powered and only a limited number of electronic elements are active to monitor and initiate the start-up sequence. Another benefit of reduced mass is the use potential of battery power supplies such as 3.3 volts, to operate rotating memory products. A further benefit is that higher storage capacities can be attained in the disk drive. For example, more disks offering more recording surfaces can be implemented on the same spindle motor without any change in the system power specifications.

A metal foil disk has been described for mobile applications that provides the storage capacity of a HD and which costs no more to manufacture than the HD currently in high volume use in a hard disk drive (HDD). Preferred embodiments have been identified that will reduce the manufacturing cost of the metal foil disk to less than that of a HD. Some of the robust features of the head/disk interface (HDI) with the metal foil disk will now be illustrated. First, the effect of mechanical shock will be described. Later, the effects of high-speed track-to-track access will be presented.

To evaluate the effect of mechanical shock, consider a pair of opposed non-contact magnetic head sliders, which write and read data to and from a metal foil disk (with characteristics similar to disk 22 of FIG. 2) that rotates at 3600 rpm. The sliders are of the 50% industry standard size (approximately 0.081 inch length and 0.061 inch width). The air which is entrained between slider and disk due to viscous effects and relative motion becomes pressurized. The pressurized air film then serves to allow the slider to fly above the disk without contact during normal operation. The distributed force of the air pressure acting on the slider air bearing surfaces balances the applied mechanical (preload) force to the slider, allowing the slider to fly in equilibrium. The proper set of dimensions for the air bearing surface geometry of the slider causes the slider to fly at a desired distance, or flying height (FH), above the disk. Currently, the recording elements of HDD heads fly at a distance of about two microinches above the disk surface. As the demand for increased data storage continues, the FH values required in future disk drives will continue to decrease.

Figure 16:
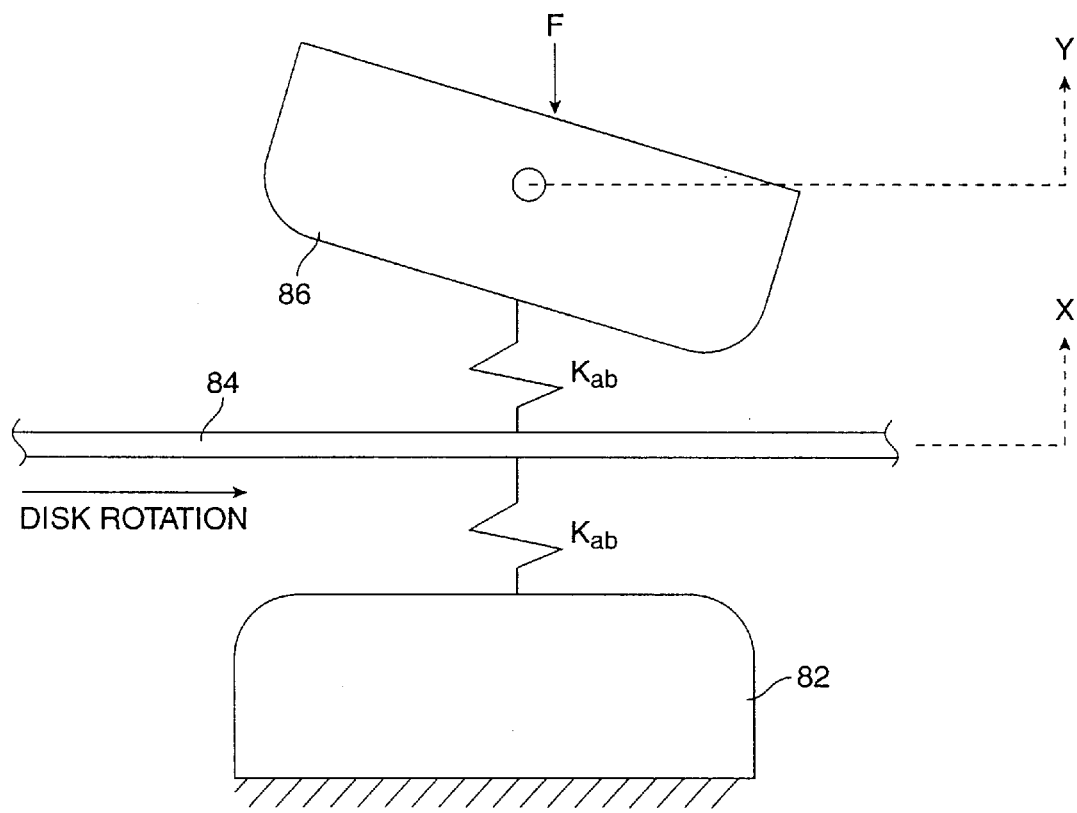
FIG. 16 is a schematic illustration of an air bearing force created by an air film.

The air bearing force created in the air film can be represented by a spring constant and a displacement, as shown in FIG. 16. In the model of FIG. 16, a lower head 82 is rigidly mounted relative to the plane of a disk 84, and only an opposing head slider 86 receives an applied mechanical force F to create the low clearance air bearing interface between each slider and its corresponding adjacent disk surface.

The change in FH and the stability of motion of each slider, when subjected to dynamic forces, can be studied with the simplified spring/mass system shown in FIG. 16. Although slight damping is present through the mechanical elements which connect to the sliders and from viscous dissipation of energy in the air film between sliders and disk, these damping effects are not considered here. The primary interest in this model is to determine if impact between slider and disk surfaces occurs after the shock. After setting values for (slider mass, applied load force, air bearing spring constants, disk substrate mass density, disk thickness, and initial FH value), the study consists of initiating a mechanical shock to the disk and tracking the response of the 2 degrees of freedom system shown in FIG. 16. A time response of the flying height level of each head is then obtained. A computer code was written to evaluate the time history of the flying height response of the HDI of FIG. 16.

Figure 17:
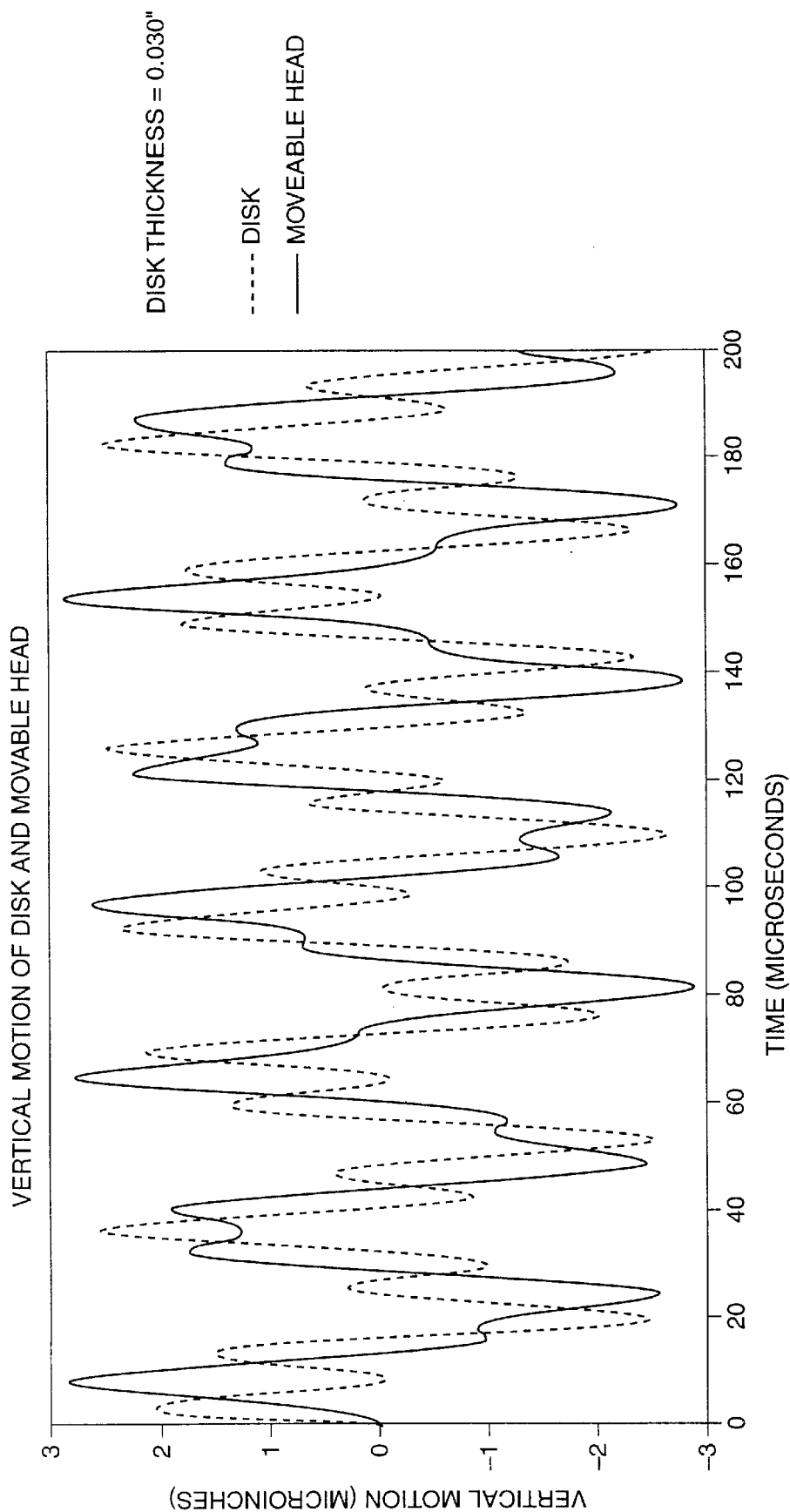
FIG. 17 is a graph showing a vertical motion response for a HD having an aluminum substrate of 30 mils and a movable slider when a mechanical shock is applied to the HD.
Figure 18:
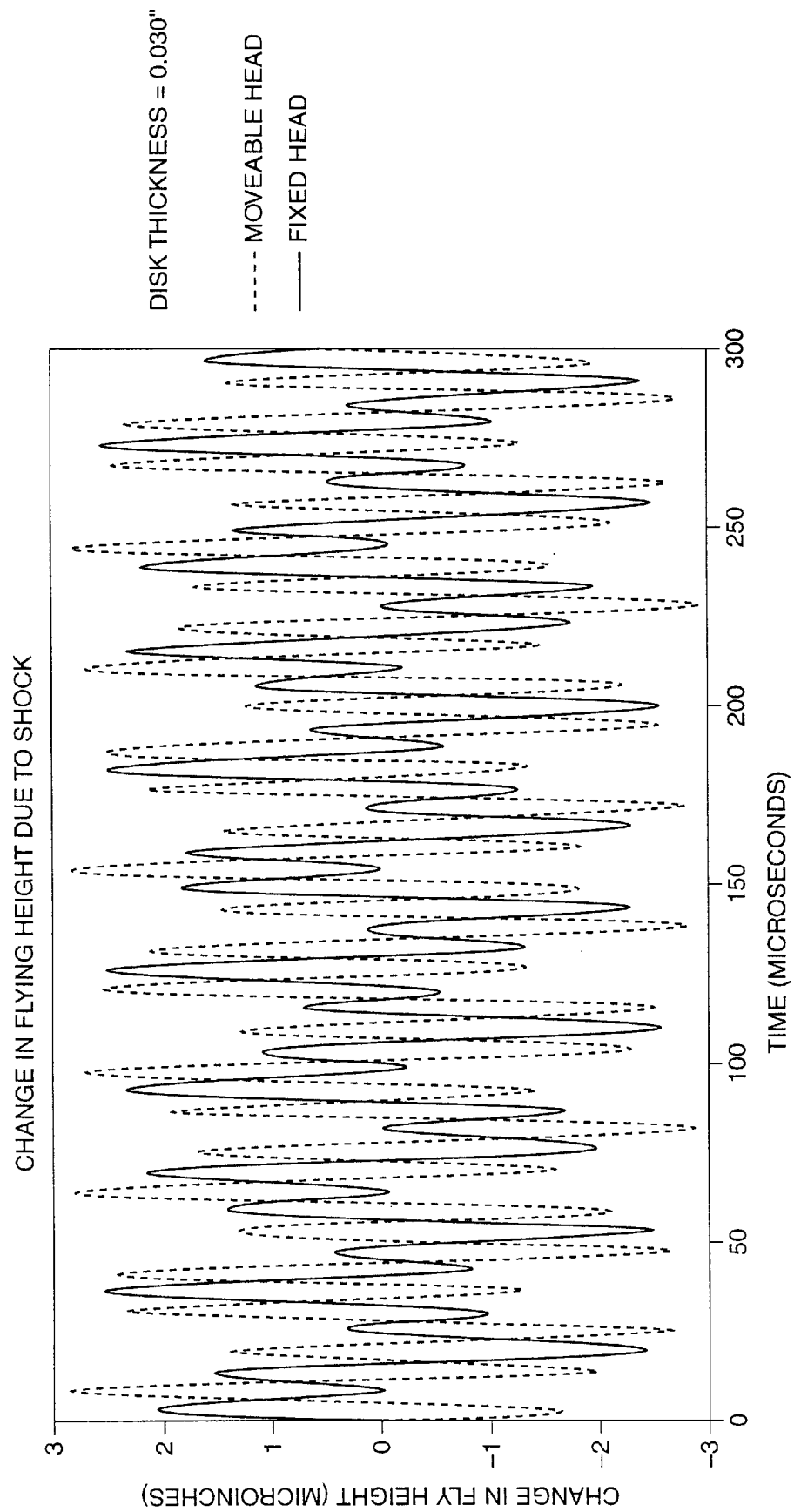
FIG. 18 is a graph showing the changes in flying height on both sides of the HD of FIG. 17.

First, consider the effect of disk thickness on shock response for the aluminum disk which is the substrate material of the majority of HDs currently in use. The aluminum substrate of HDs is typically about 0.030 inch (30 mils) thick. With the disk substrate thickness at a value 30 mils, a mechanical shock to the disk results in a vertical motion response for the disk and the movable slider, as shown in FIG. 17. This results in FH changes on both sides of the disk, as shown in FIG. 18. In this case, the disk thickness is substantial, and the energy of the shock is transmitted through the air film to the movable head, resulting in significant motion of the movable head. Fluctuations in the disk vertical position are about ±2.5 microinches, while fluctuations in the movable head vertical position are about ±2.8 microinches. Change in FH for both heads are larger in magnitude than the initial flying height. There is no head/disk impact model built into this HDI model, so a prediction of impact is made when the most negative change in FH is larger in magnitude than the initial minimum flying height of the head. Thus, since the fluctuations of flying height are more than the initial minimum static (equilibrium) flying height of each head, head/disk impact is predicted for each head as a result of the mechanical shock. Head/disk impact during full speed rotation can cause damage to the HDI, and possibly result in a loss of recorded data. Such a condition should be avoided.

Figure 19:
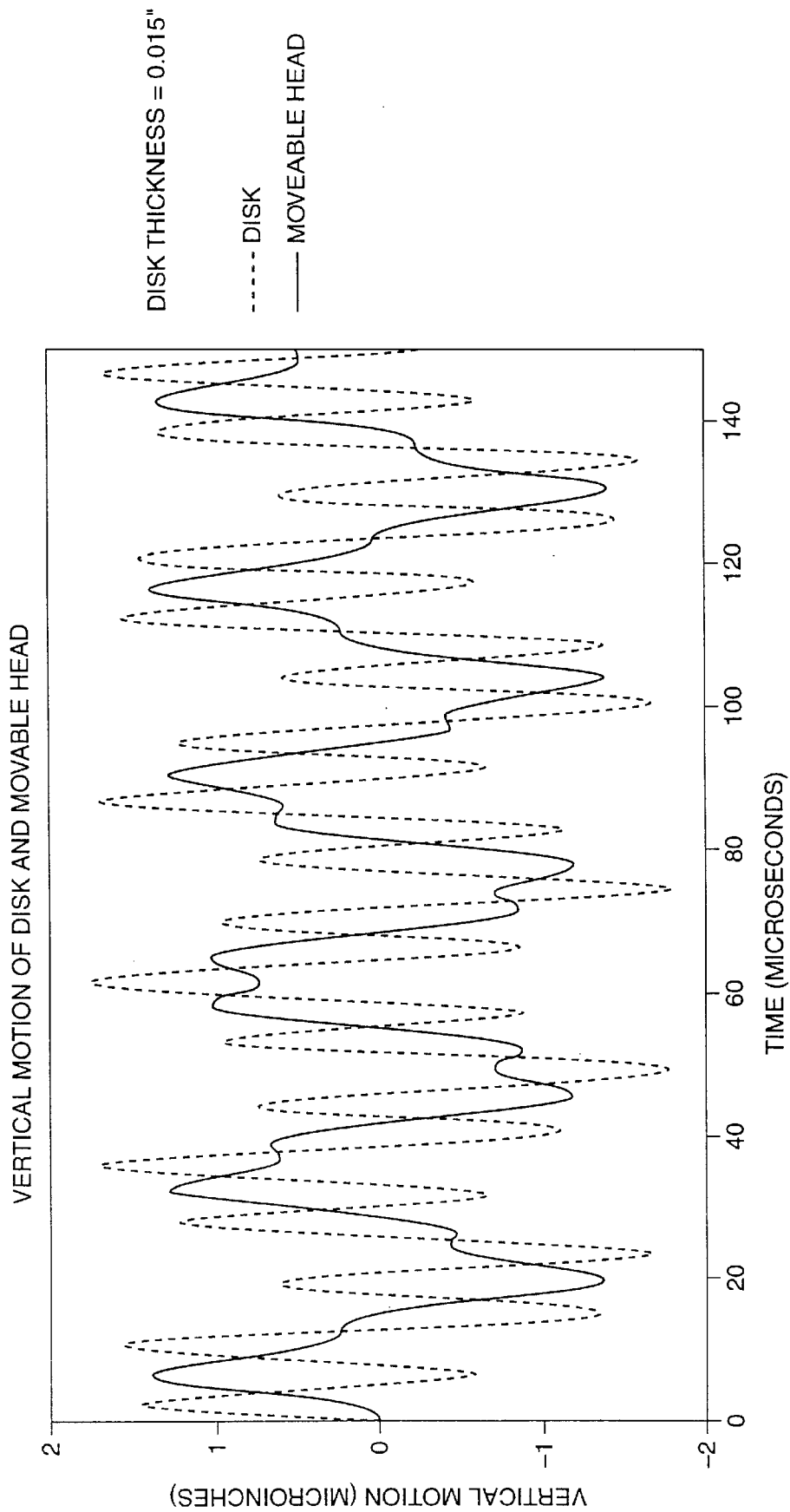
FIG. 19 is a graph showing a vertical motion response for a HD having an aluminum substrate of 15 mils and a movable slider when a mechanical shock is applied to the HD.
Figure 20:
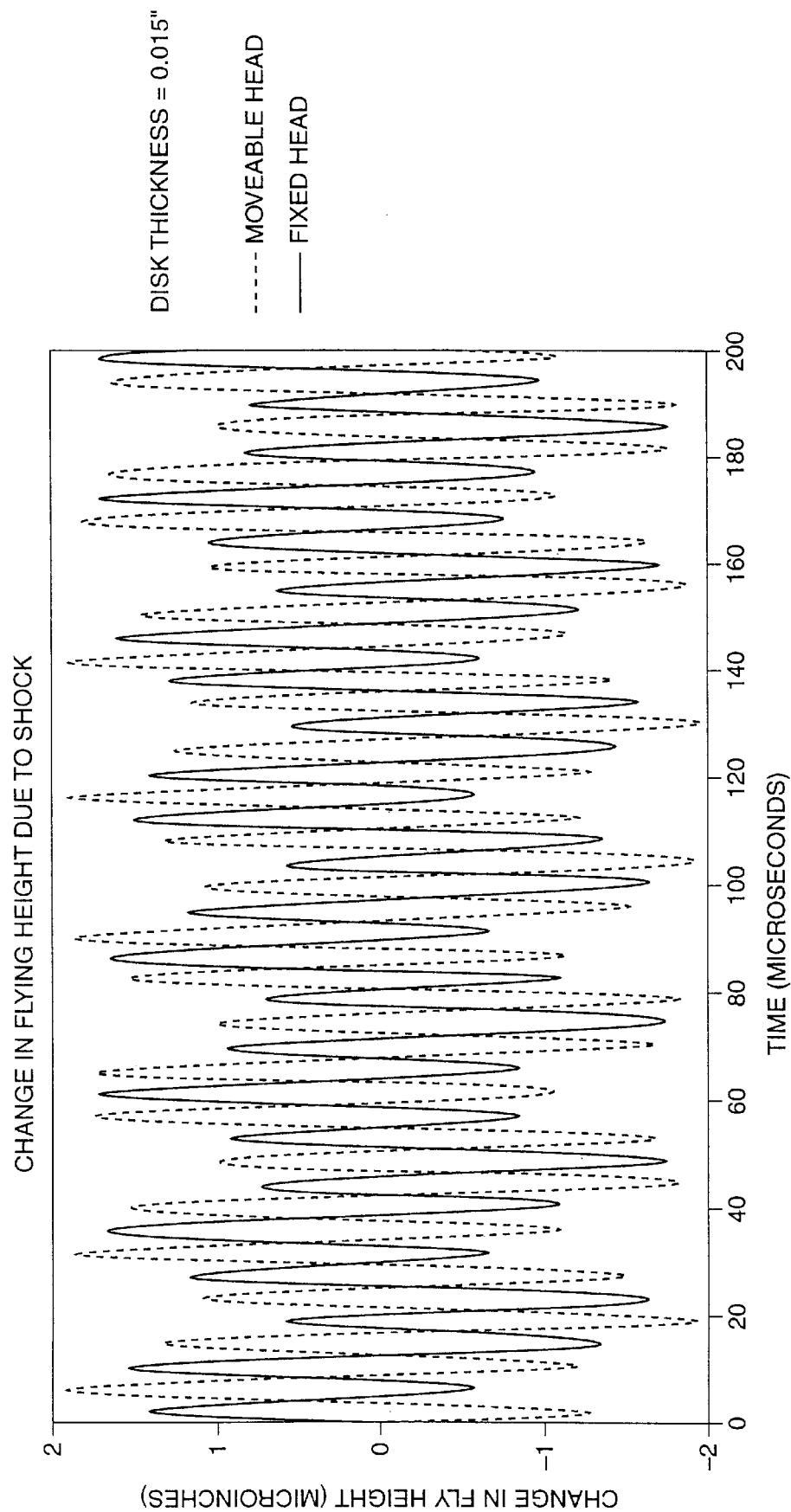
FIG. 20 is a graph showing the changes in flying height on both sides of the HD of FIG. 19.
Figure 21:
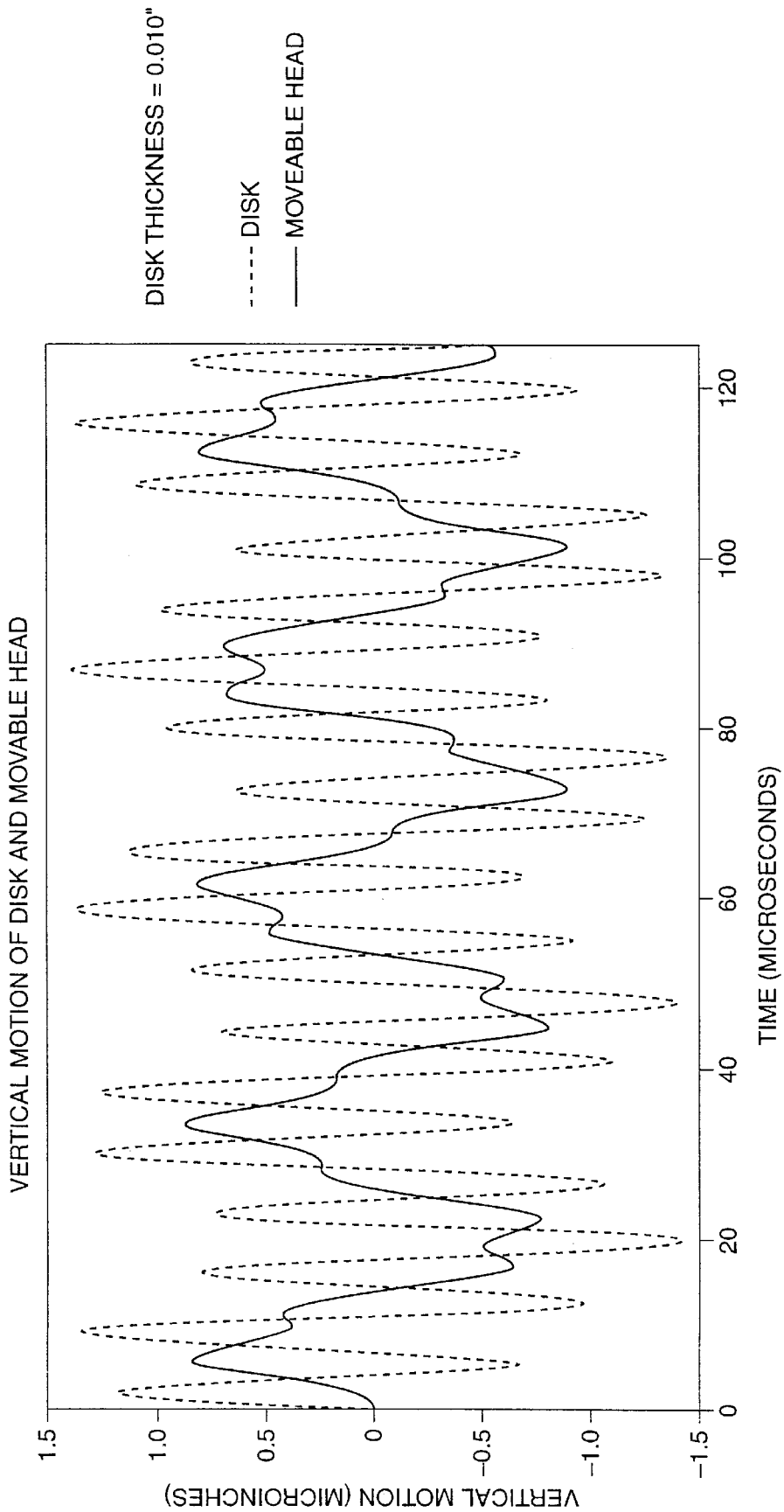
FIGS. 21–25 are graphs showing the time histories of disk vertical motion for an aluminum substrate disk having thicknesses of 10, 5, 2, 1, and 0.5 mils, respectively.
Figure 22:
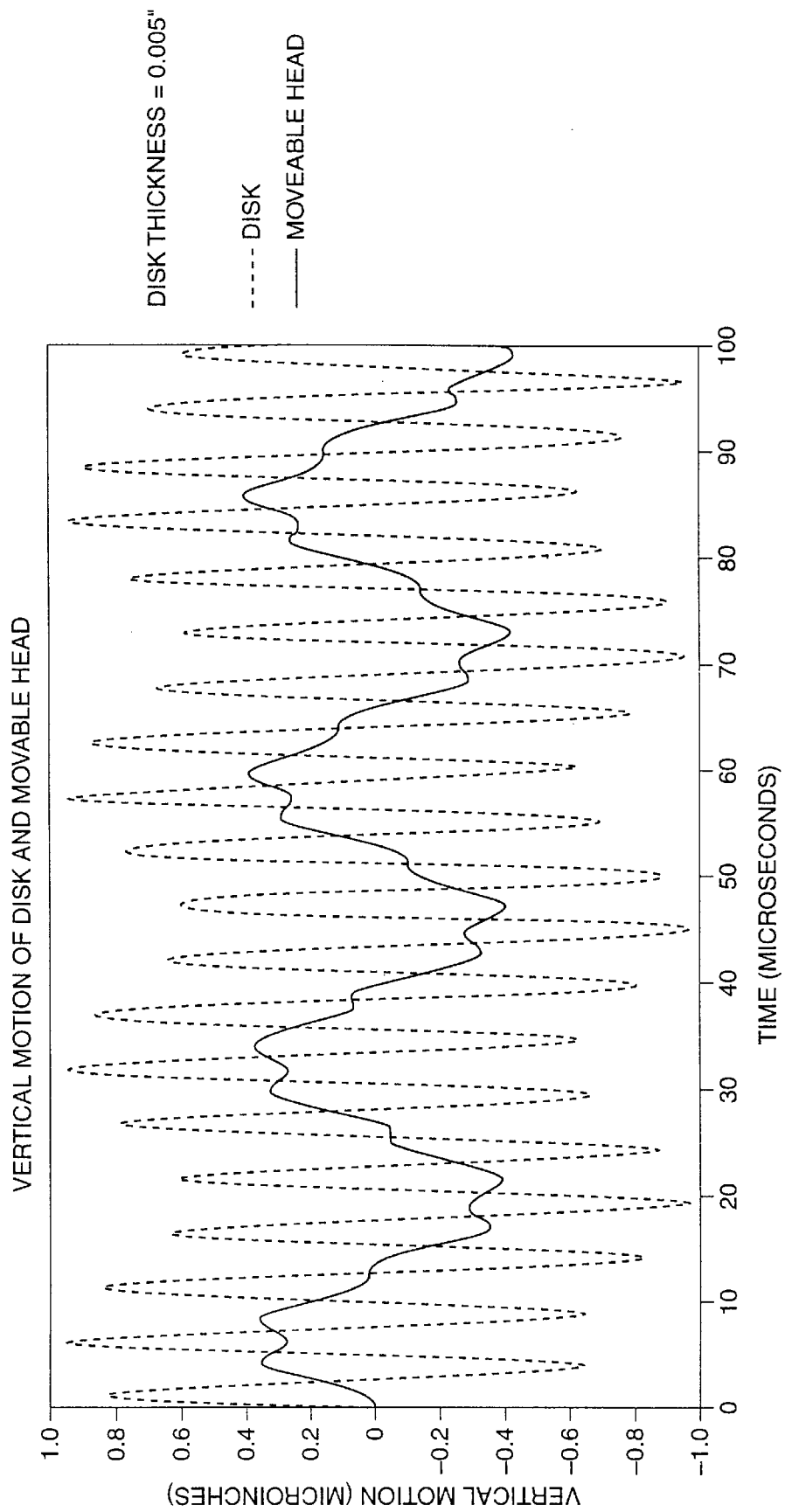
Figure 23:
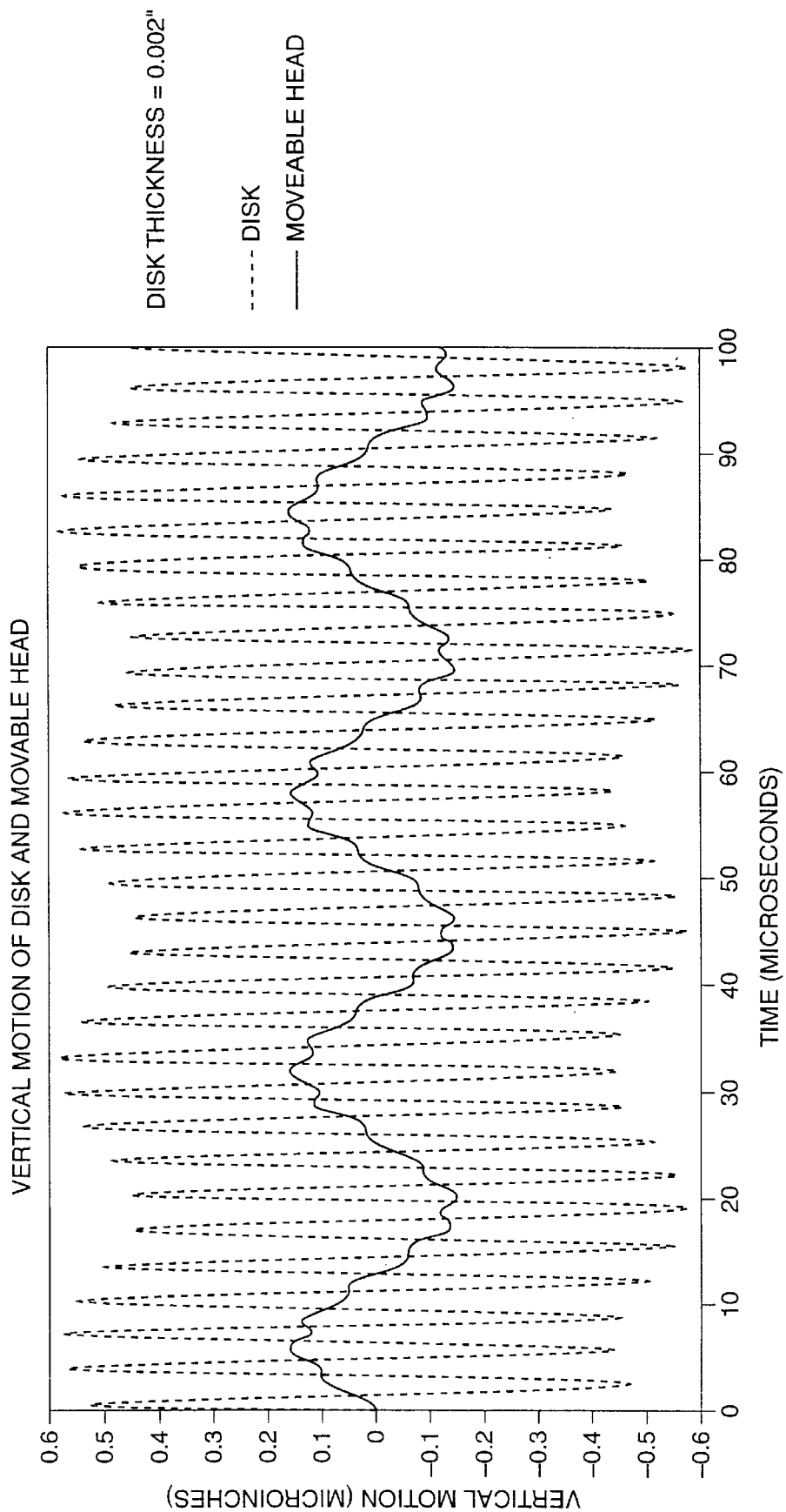
Figure 24:
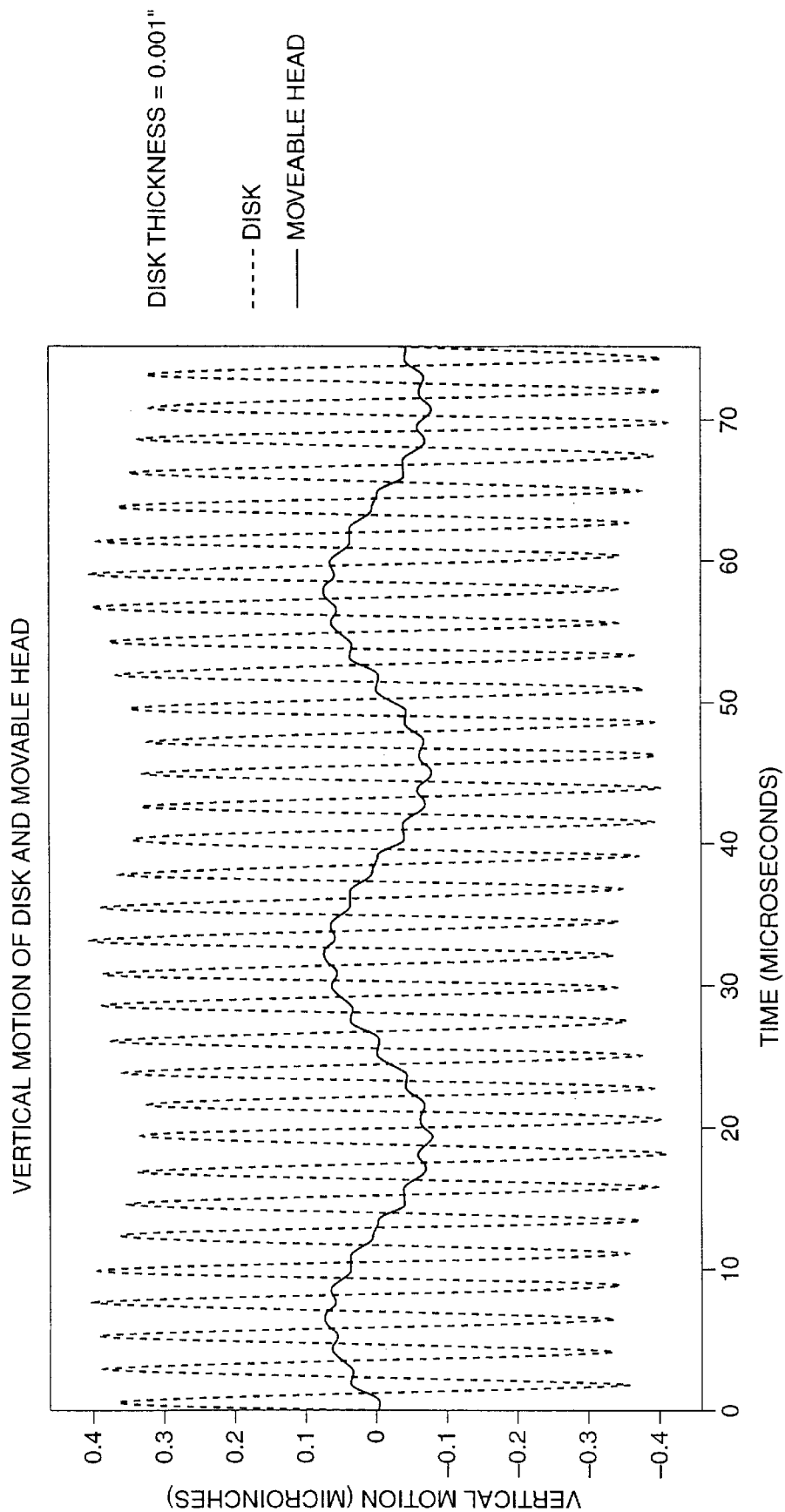
Figure 25:
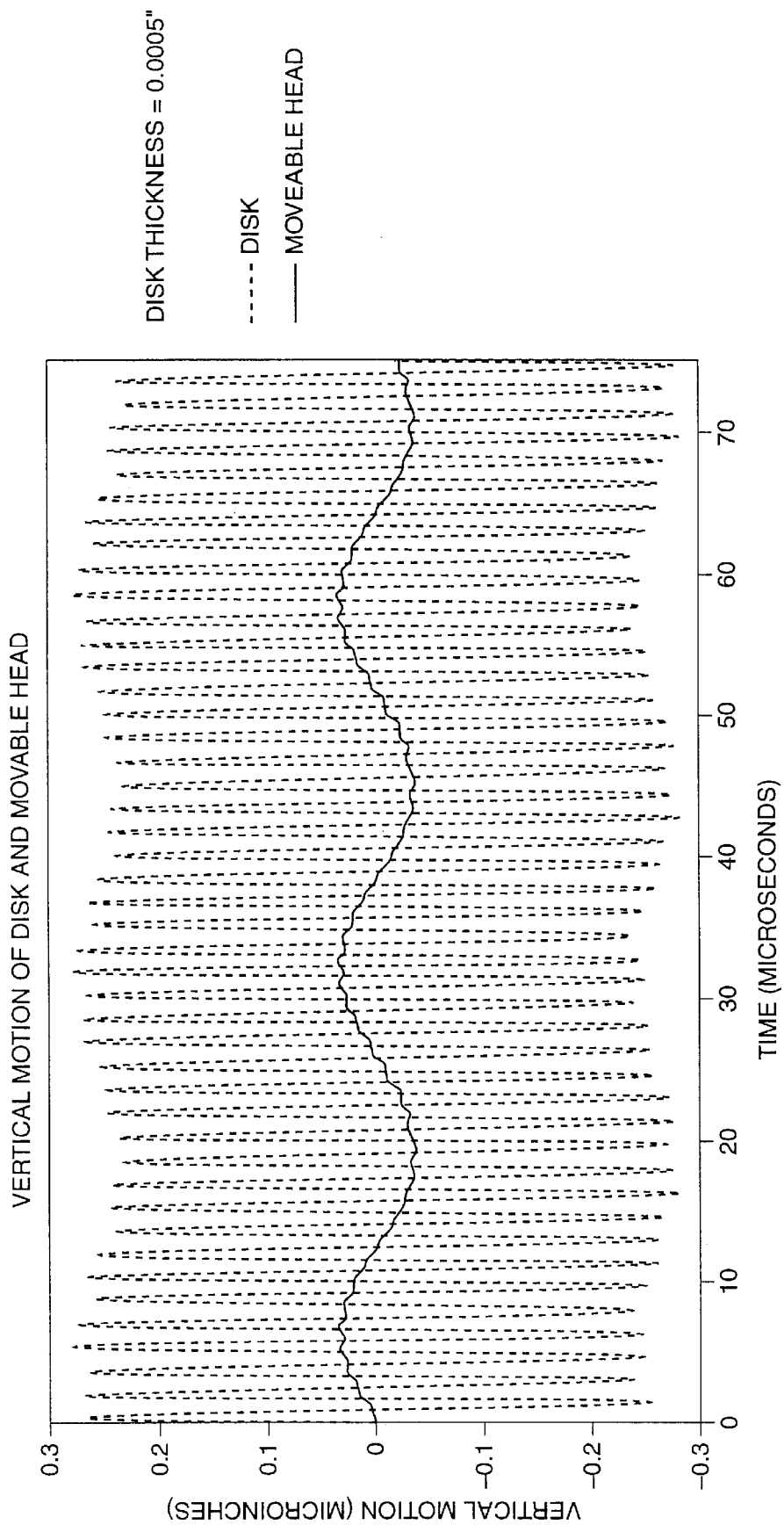
Figure 26:
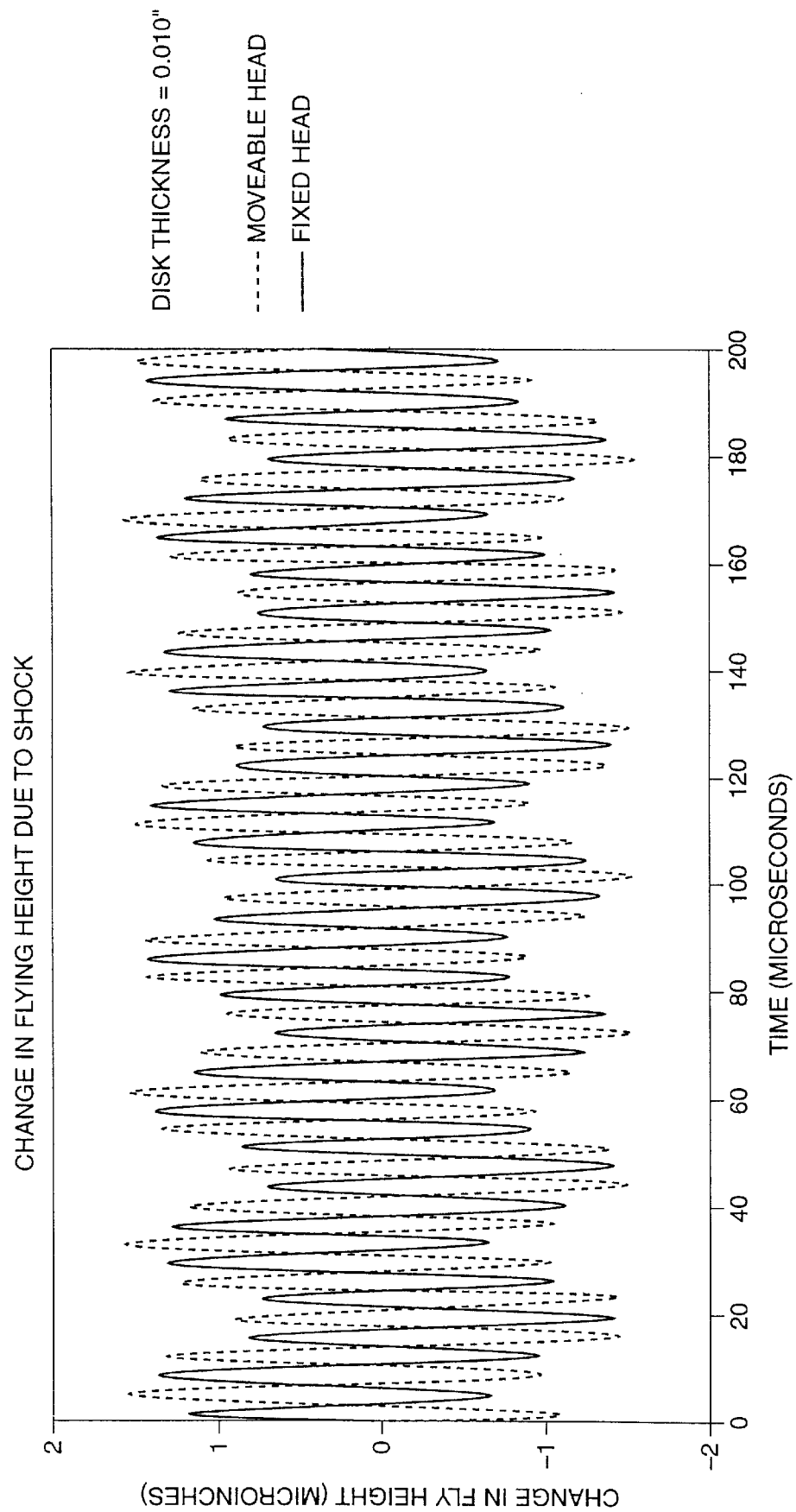
FIGS. 26–30 are graphs showing the flying height fluctuations for the disks of FIGS. 21–25, respectively.
Figure 27:
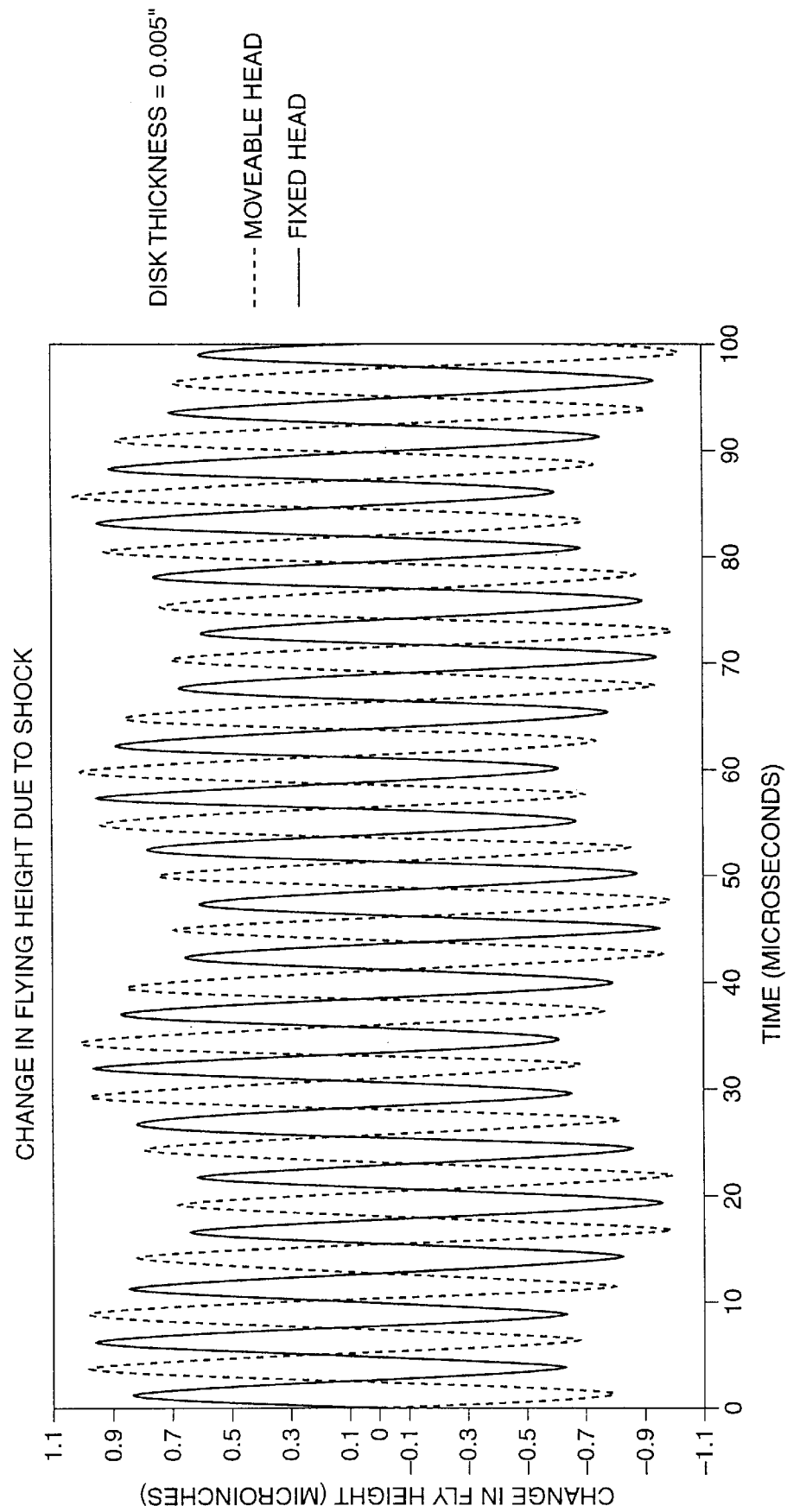
Figure 28:
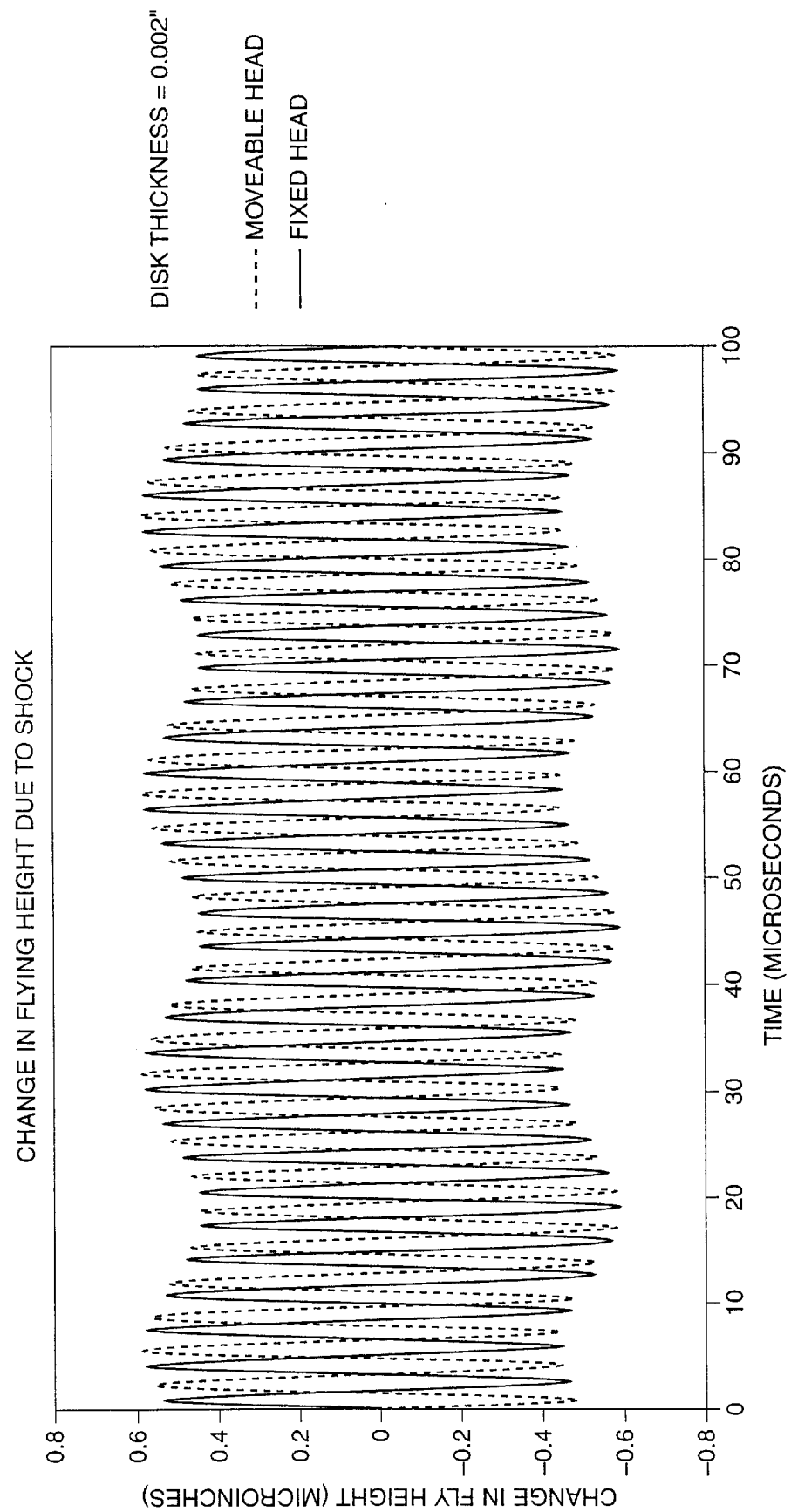
Figure 29:
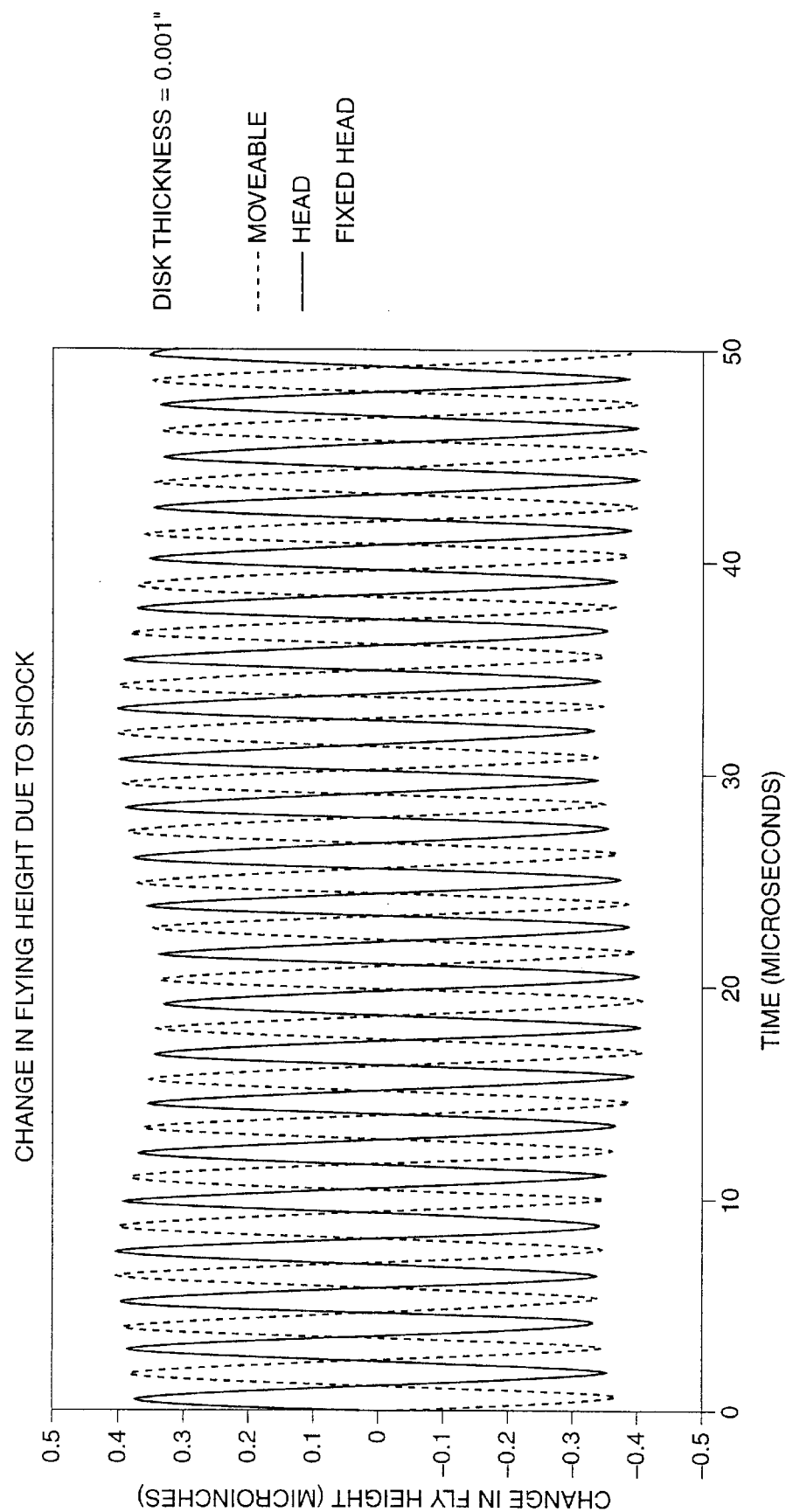
Figure 30:
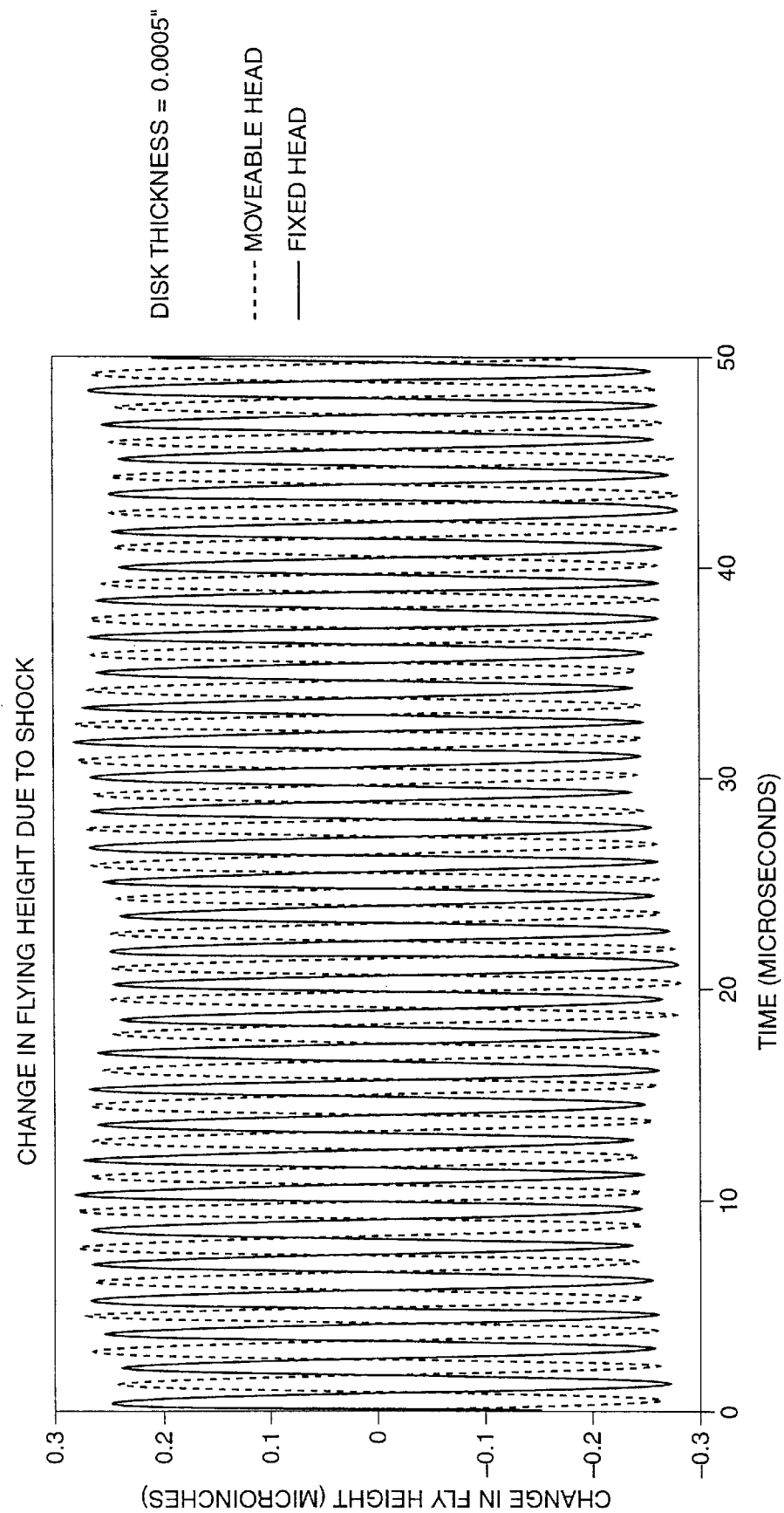

When the disk thickness is reduced, the resulting motion of the disk, after receiving the mechanical shock, contains reduced energy. The air bearing films adjacent to the disk now have a larger influence on attenuating the disk vertical motion, and the fluctuations in FH decrease. When the aluminum disk thickness is reduced to 15 mils, the resulting motion histories of the disk and movable slider are shown in FIG. 19, and the FH histories are shown in FIG. 20. In this case, the FH fluctuations are reduced so as to barely avoid slider/disk impact. As the disk thickness is reduced further, the resulting disk vertical motion amplitude and changes in FH decrease monotonically.

Figure 31:
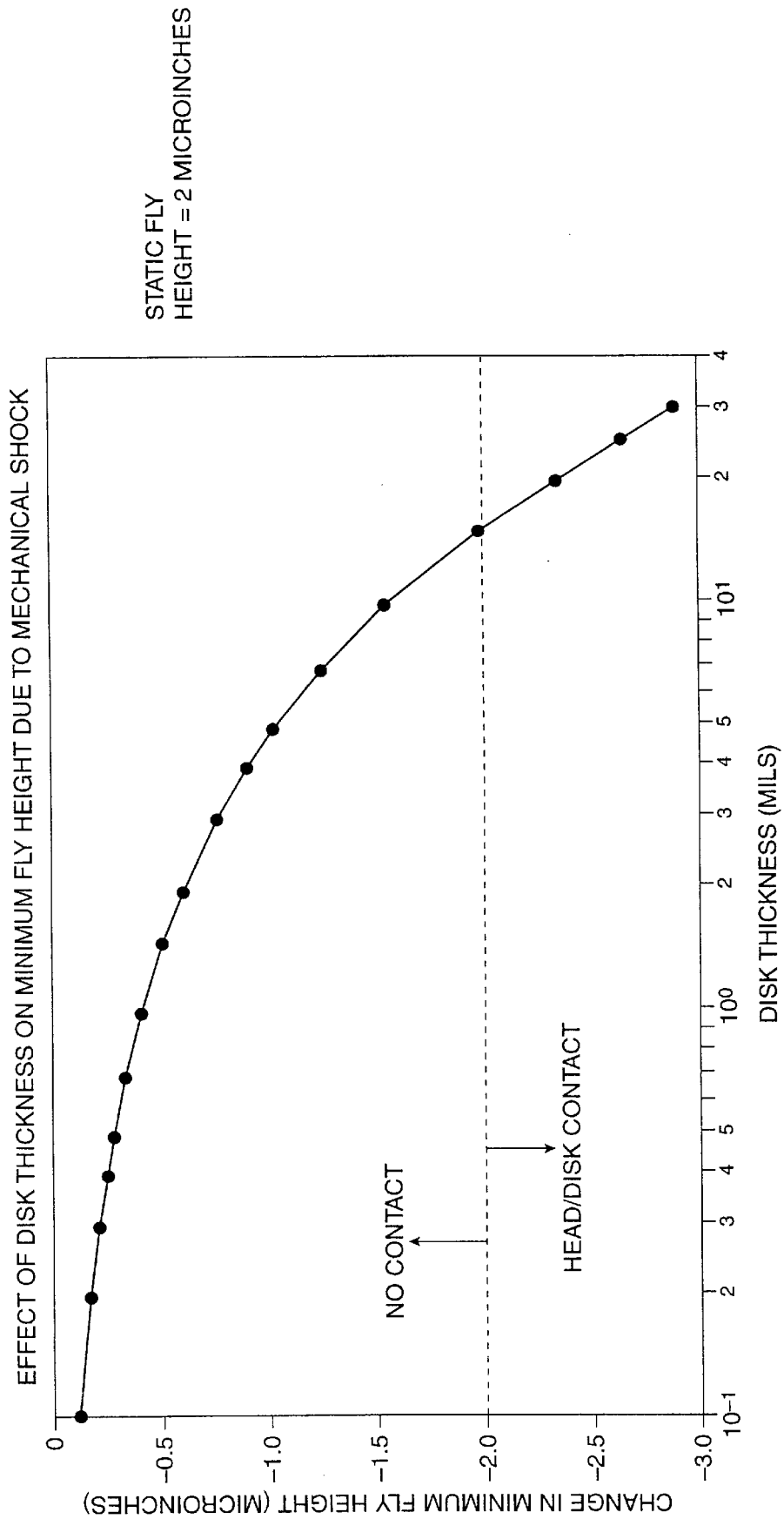
FIG. 31 is a graph showing the most negative change in flying height during dynamic motion after shock input, for a given disk thickness, over a range of aluminum disk thicknesses and summarizes the results of FIGS. 18, 20, and 26 through 30.

As the disk thickness decreases, the disk mass and kinetic energy decrease, while the air film stiffness remains fixed, resulting in an increased adjacent air bearing influence and control of the disk motion. As the disk thickness is decreased to (10, 5, 2, 1, and 0.5) mils, the resulting fluctuations in flying height are approximately ±(1.5, 1.0, 0.6, 0.4, and 0.25) microinches, respectively. The time histories of disk motion and FH fluctuation for these disk thicknesses are presented in FIGS. 21 through 30. The high frequencies of the disk motion for very thin metal foils are due to the high stiffness, low mass disk/air film interface which results. The most negative change in flying height during dynamic motion after shock input, for a given disk thickness, is included in FIG. 31 over a range of aluminum disk thicknesses and summarizes the results of FIGS. 18, 20, and 26 through 30. The thicker aluminum substrates of HDs do not have adequate shock resistant properties. As indicated by the results presented in FIG. 31, aluminum foil substrates with thicknesses of 0.015 inch or greater do not have adequate shock resistance to insure a non-impact condition during low flying height operations. However, thin aluminum foils, i.e., substrates having a thickness that is less than about 0.010 inch, do have useful shock resistant properties and are compatible with the low flying height, non-contact recording heads of current and near term disk drives. While the air bearing of a recording head slider is designed primarily to be compatible with the requirements of steady-state flying over the recording surface, it has been observed in this disclosure that the air bearing stiffness of such recording heads can be sufficient to accommodate mechanical shock input to this HDI while reducing or avoiding head/disk impact. Such impact can damage the disk surfaces and recording heads, and result in a loss of recorded data. The reduction and elimination of head/disk impact as a result of mechanical shock is a very important and desired characteristic of a mobile data storage system. Mechanical shock is a much more prevalent condition in a mobile storage system than in the more dynamically isolated stationary data storage device.

Figure 32:
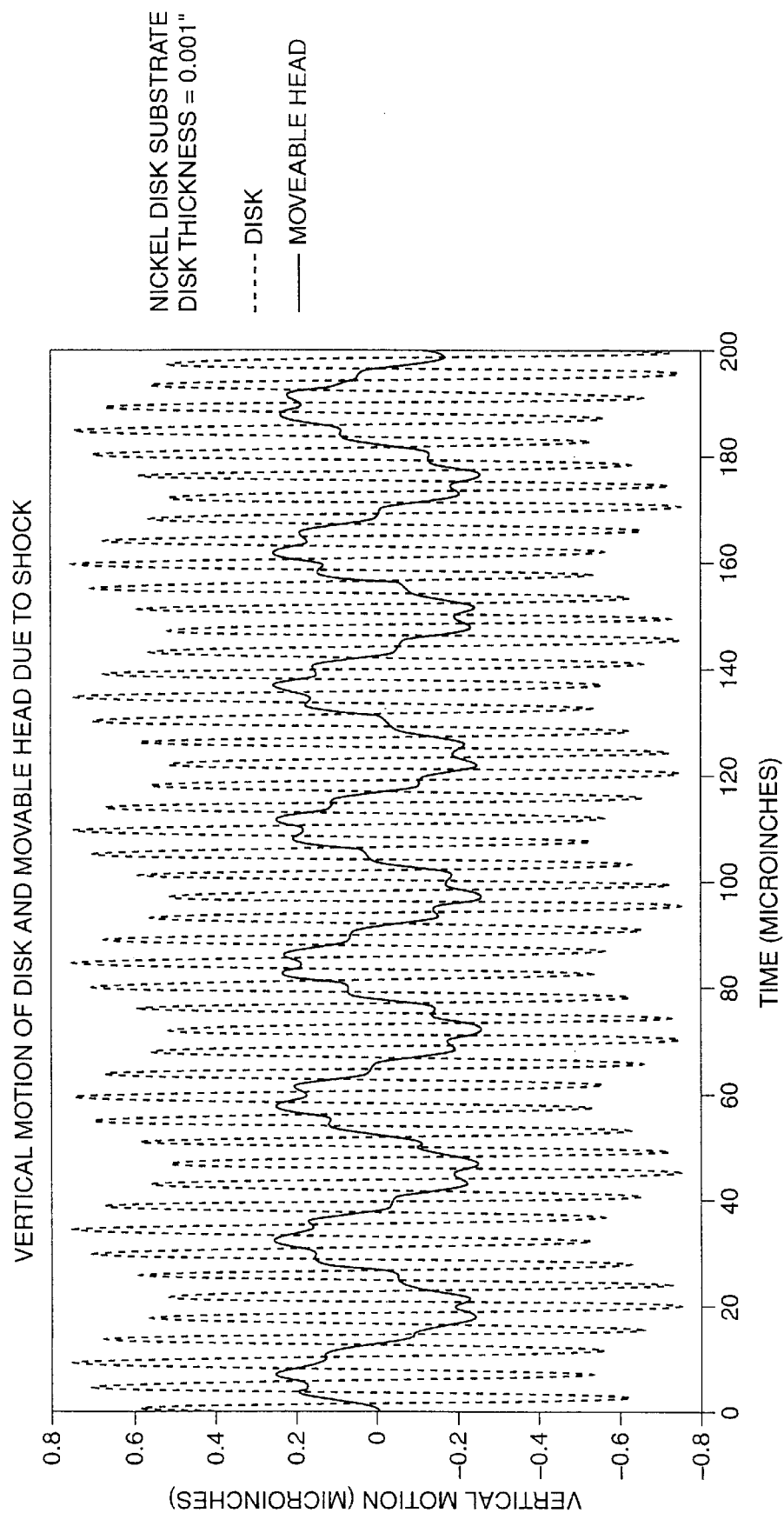
FIGS. 32 and 33 are graphs showing the vertical motion histories for disks having a nickel foil substrate with thicknesses of one mil and two mils, respectively.
Figure 33:
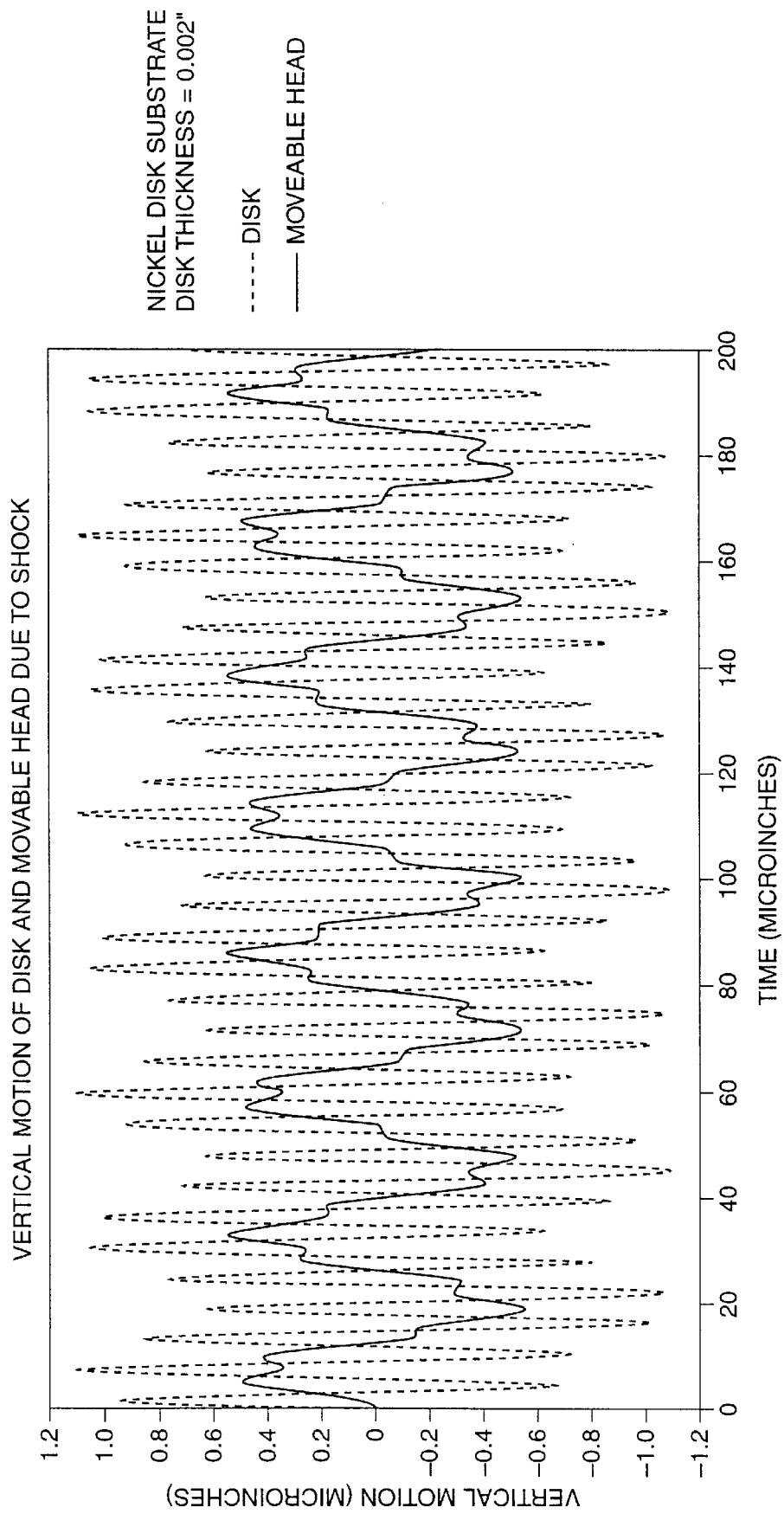
Figure 34:
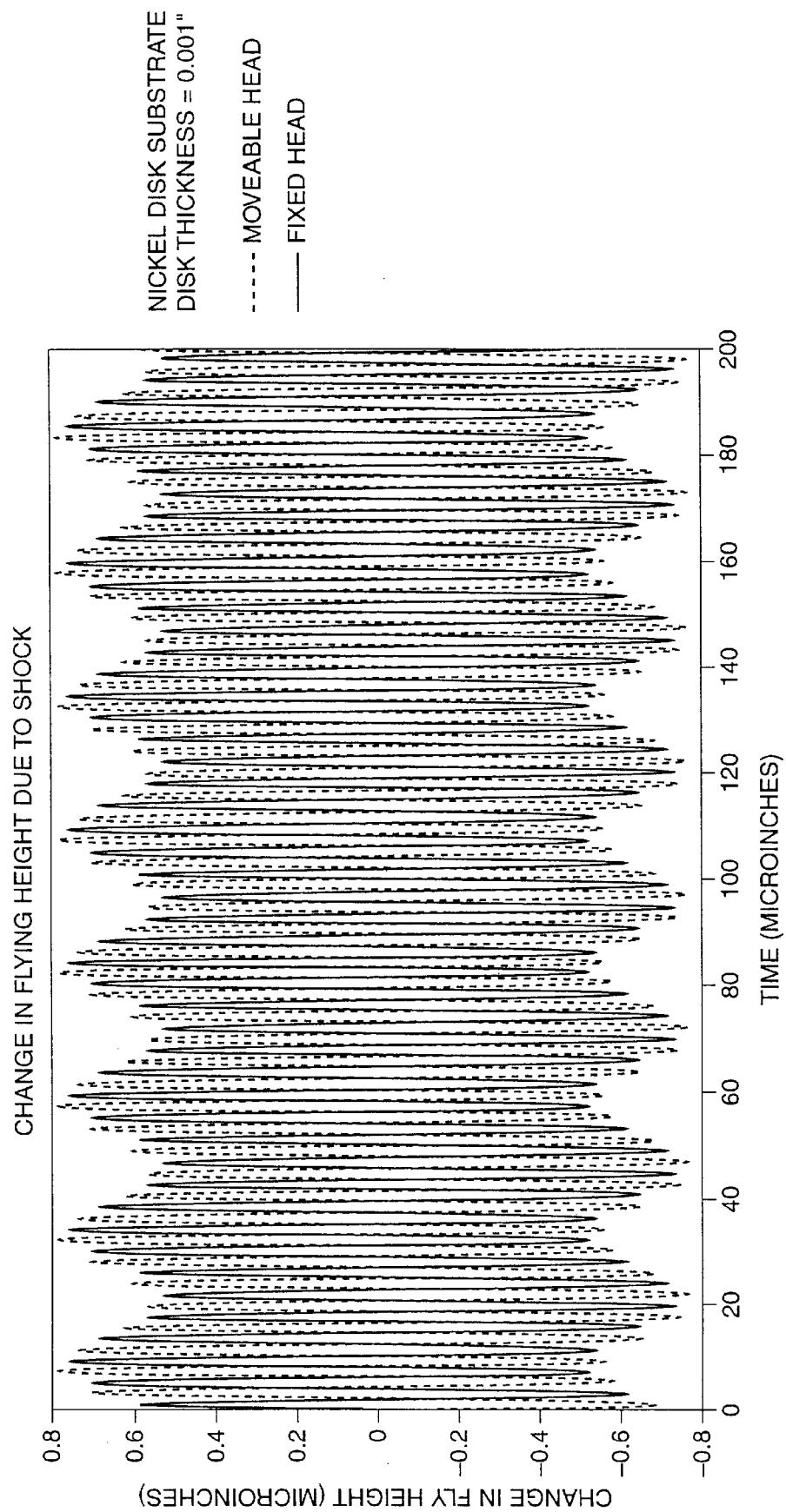
FIGS. 34 and 35 are graphs showing the flying height histories corresponding to FIGS. 32 and 33, respectively.
Figure 35:
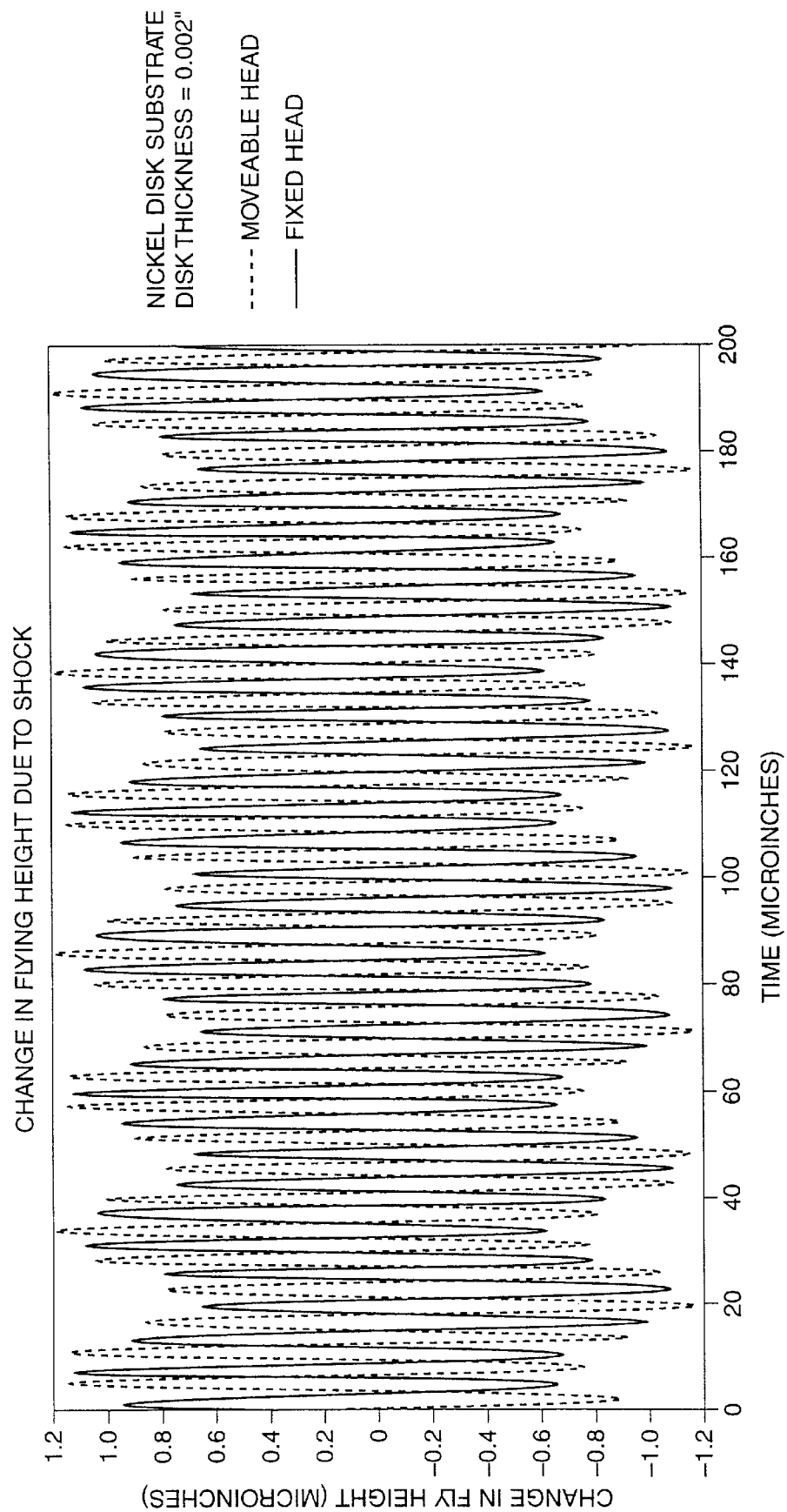

Next, the shock resistant properties of a nickel foil disk will be described. Vertical motion histories are presented on FIGS. 32 and 33 for nickel foil thicknesses of one mil and two mils, respectively, subject to the same conditions as those considered for the aluminum foil disk. Flying height histories appear in FIGS. 34 and 35. The mass density of nickel is approximately three times larger than aluminum. For a given disk thickness and given initial disk velocity due to shock, the elevated magnitudes for nickel mass and associated kinetic energy tend to explain the increased disk and slider motion, and increased flying height variations due to the nickel foil disk. Nickel foil thicknesses of one mil and two mils produce FH variations of approximately ±0.8 microinches and ±1.2 microinches, respectively, for the same conditions considered earlier. Neither of these foil thicknesses would then be predicted to produce a head/disk contact condition with heads that fly nominally at two microinches and which are subject to the conditions of this study. The shock performance of the HDI for both of these nickel disk thicknesses are superior to that of a HDD.

Other metallic foil disks would also be expected to provide non-impact head/disk interface histories when subjected to high mechanical shock environments. The metal foil disk has been shown to possess superior shock resistance as compared to a HD. This occurs because the air bearing films of the directly opposed magnetic head sliders are quite stiff and are able to control and limit the vertical excursion of the low mass, thin metal foil disk after mechanical shock has occurred. However, the metal foil disk must also possess sufficient elastic stiffness in order for the magnetic head sliders to be accessed without head/disk impact at high speed from one data track to another. Head/disk impact during track-to-track access can cause damage to the head and disk surfaces and result in a loss of recorded data. Such high-speed access is necessary in order for the time required to transfer large data files to not be excessive. The HD, because of its thickness, possesses high elastic stiffness. However, thin nonmetallic disks such as those currently used in floppy disk drives, have inadequate stiffness properties with regard to high-speed access motion. In sections that follow, the influence of disk stiffness during high speed access motion will be compared for the metal foil disk and the Mylar floppy disk.

Figure 36:
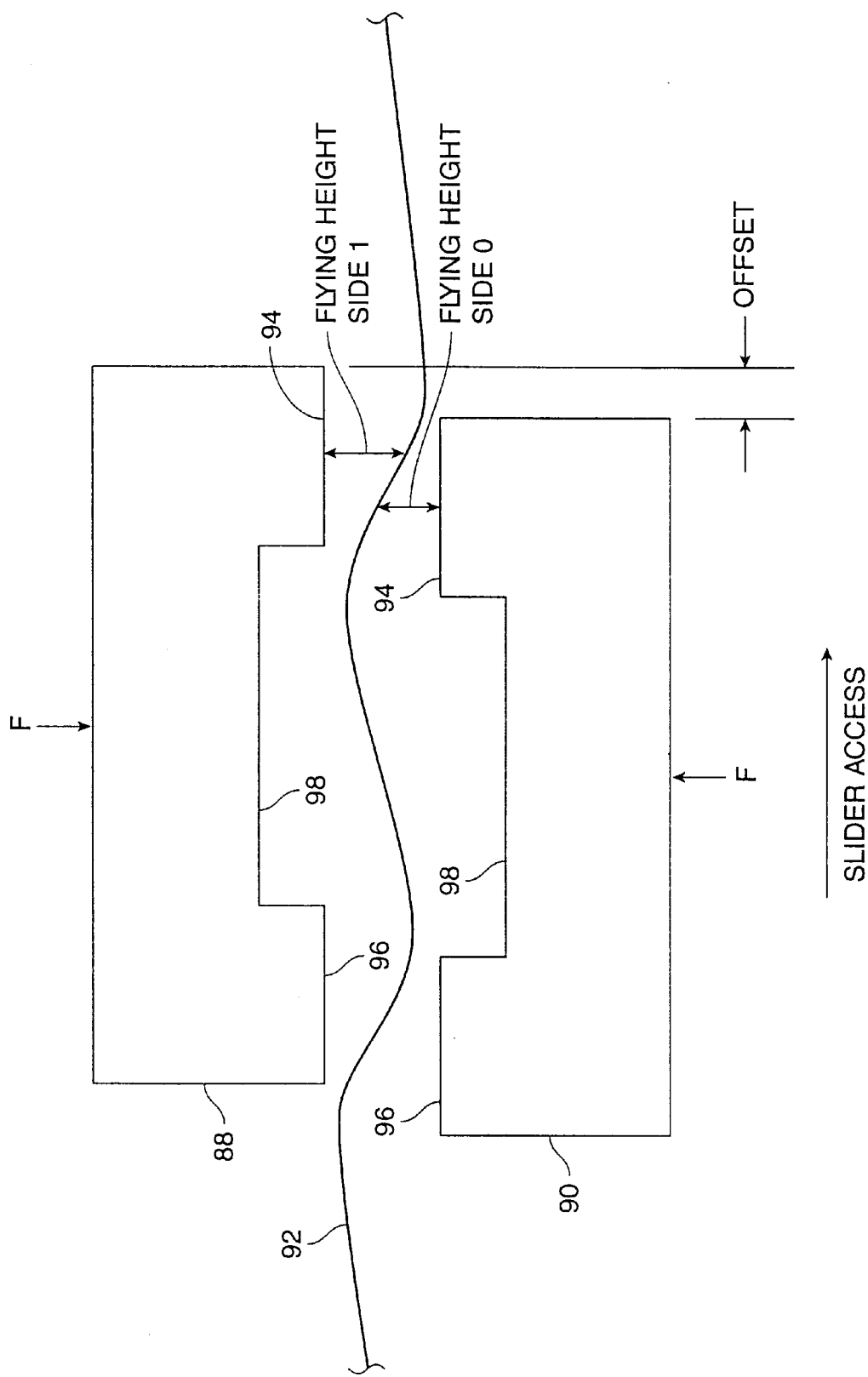
FIG. 36 illustrates a pair of accessing and off-set sliders having two straight longitudinal rails which are separated by a rectangular ambient pressure relief slot.
Figure 37:
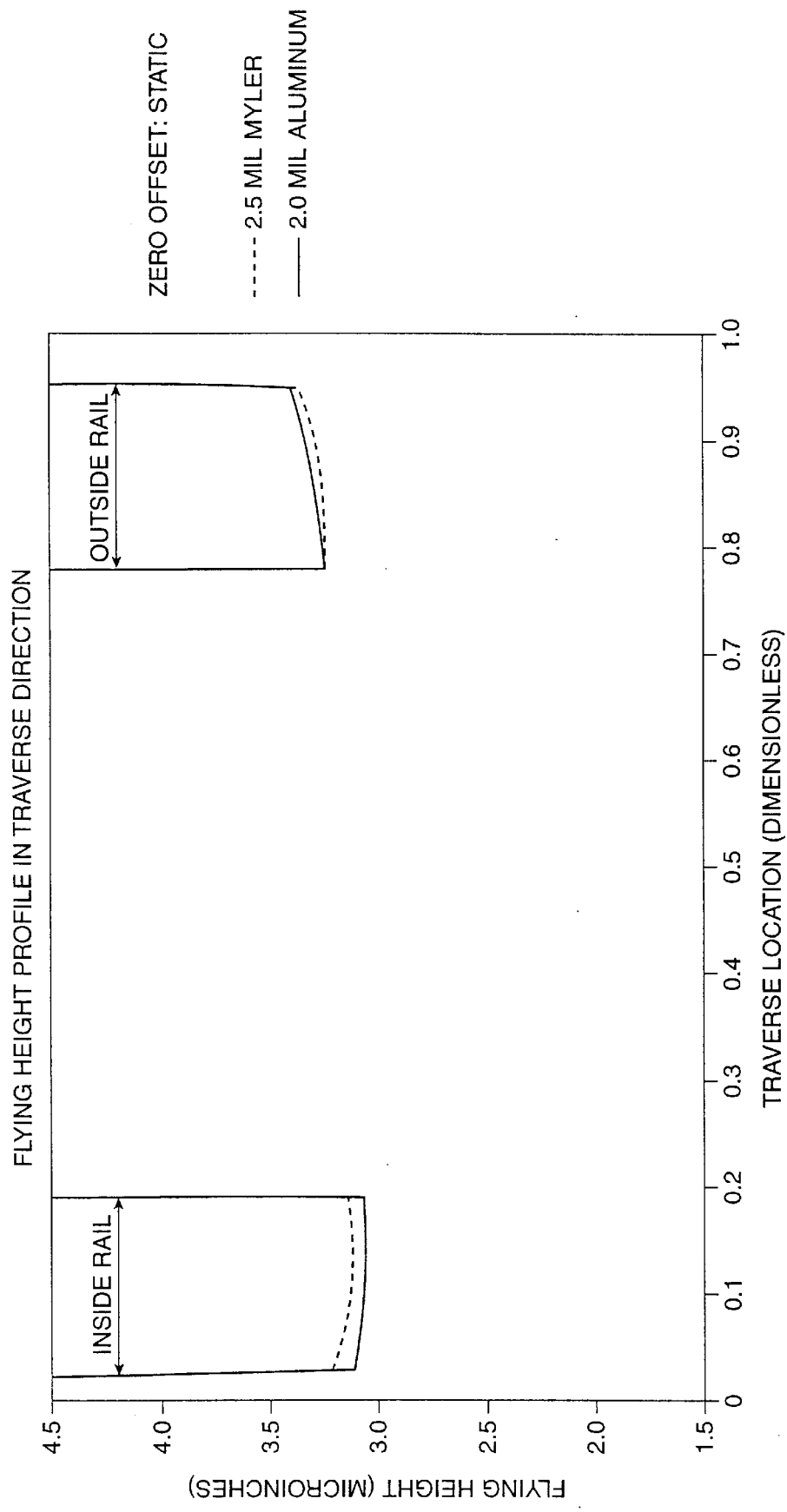
FIG. 37 is a transverse plot of the flying height at a longitudinal slider location, which contains the absolute minimum slider FH value for two different disk configurations under stationary and zero off-set conditions.

As shown in FIG. 36, consider two directly opposed 50% industry standard "Winchester" type sliders 88 and 90, which fly at the inside track of a 3.5 inch disk 92 spinning at 3600 rpm. The sliders 88 and 90 are positioned over the data surface by a linear actuator (not shown), which maintains the sliders 88, 90 at a zero skew angle with regard to the disk tangential direction. The sliders 88, 90 each have two straight longitudinal rails 94, 96 that are ten mils wide and which are separated by a rectangular ambient pressure relief slot 98. When the opposed sliders 88, 90 are situated exactly over each other with no mounting off-set, and when sliders 88, 90 are stationary (not accessing), the minimum FH is slightly over three microinches. The minimum flying height occurs near the slider trailing edge, which is typically the location chosen for the magnetic transducer. A transverse plot of the flying height at the slider longitudinal location, which contains the absolute minimum slider FH value is included in FIG. 37 for two different disk configurations under stationary conditions. These results and others that follow on the effects of access motion are taken from a computer code called AIRBEAR2. AIRBEAR2 simulates the HDI of a flexible storage medium disk drive and was written by the second author of this disclosure. In one case, the disk is composed of 2.5 mils of Mylar, which makes up the substrate of the widely used standard floppy diskette, while in the second case the disk is defined by two mils of aluminum. The flying height profiles over the separate rails in FIG. 37 are nearly identical for the two stationary slider cases. The flying height varies slightly from one rail to the other because the disk tangential velocity is slightly different over the two rails and because the sliders can take on a slight roll attitude relative to each other. The actual mounting of the directly opposed sliders typically results in a slight tolerance off-set of about one to two mils in the slider transverse direction. That is, one slider will be located off-set in the transverse direction relative to the other slider. Access motion of the sliders results in a transverse air flow, as viewed from the respective sliders. The access motion, even where there is no slider mounting off-set, causes some asymmetry in the pressure distribution across the slider rails, and results in a non-symmetric FH profile in the transverse direction.

Figure 38:
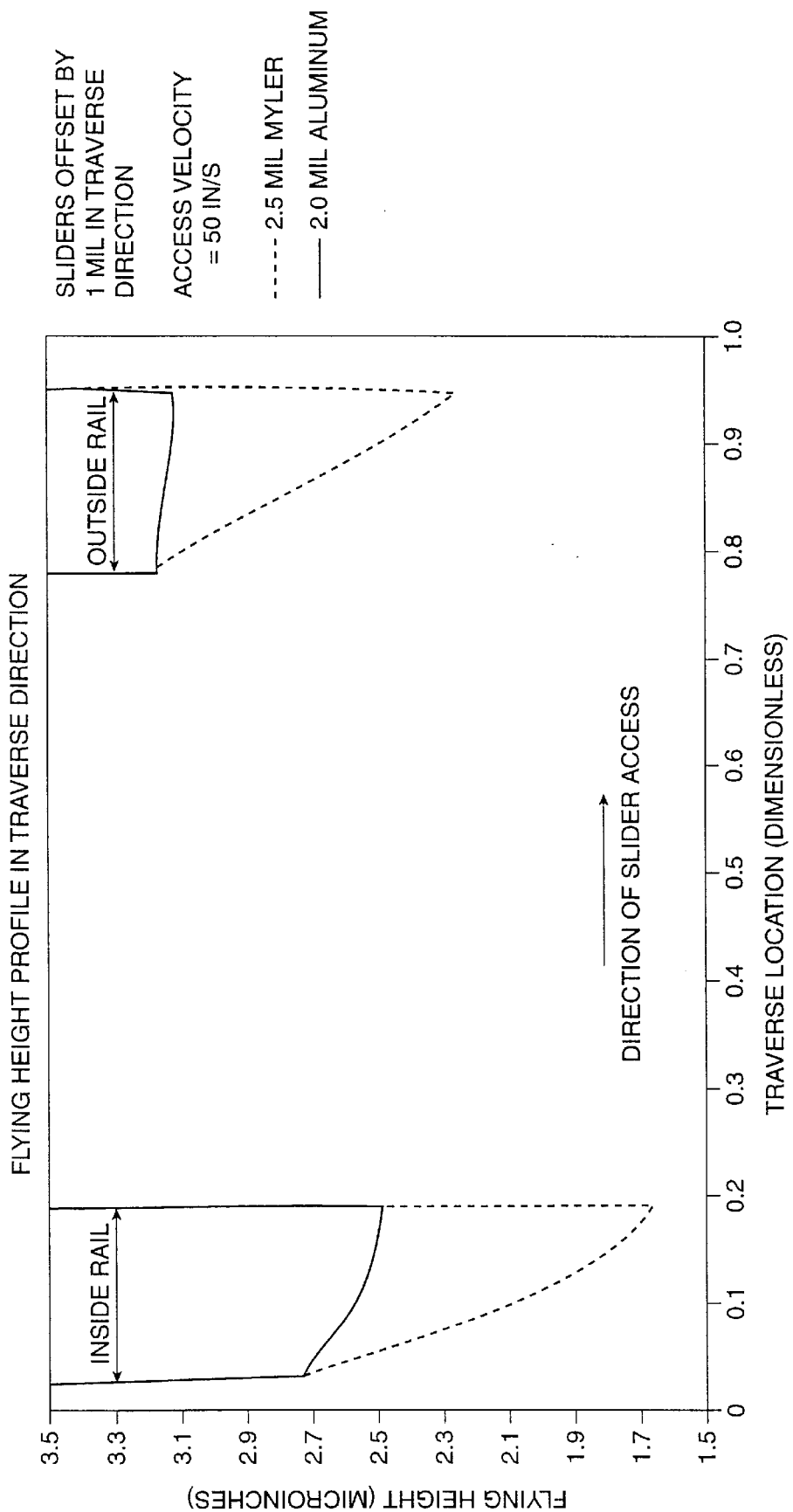
FIG. 38 is a transverse plot of flying height profiles at the longitudinal location of absolute minimum flying height for two different disk configurations subject to slider off-set and access motion.

The off-set mounting of the two sliders contributes further to the flying height asymmetry. Each slider rail which contains the leading transverse side edge (due to off-set) relative to incoming relative access motion generates a pressure effect which urges the disk away from that slider side edge, and results in a reduced flying height along the corresponding side edge of the opposing slider. This effect is shown in FIG. 36. Transverse FH profiles at the longitudinal location of absolute minimum flying height are shown in FIG. 38 for two different disk configurations. The combined effect of one mil transverse slider mounting off-set and access speed of 50. in/s is present in these results. The minimum FH with the Mylar disk is 1.66 microinches, and the minimum FH for the aluminum disk is 2.49 microinches. The modulus of elasticity of aluminum is around ten million psi while that for Mylar is only around 600,000. psi. This contributes to a much stiffer aluminum disk, as seen in FIG. 36. The aluminum disk flying height, because of the increased disk stiffness, is less sensitive to slider access motion and to slider mounting off-set. In the simulation of the Mylar disk, the resulting effect of access motion caused a reduction in flying height of nearly 50%. Although this did not result in an impact condition for the Mylar disk, it could have, when combined with typical manufacturing and environmental tolerances. In addition, since the trend is toward lower flying heights in applications, effects such as access motion which cause a significant decrease in FH values with today's products will create a larger exposure to degraded performance in the coming generation of products.

Figure 39:
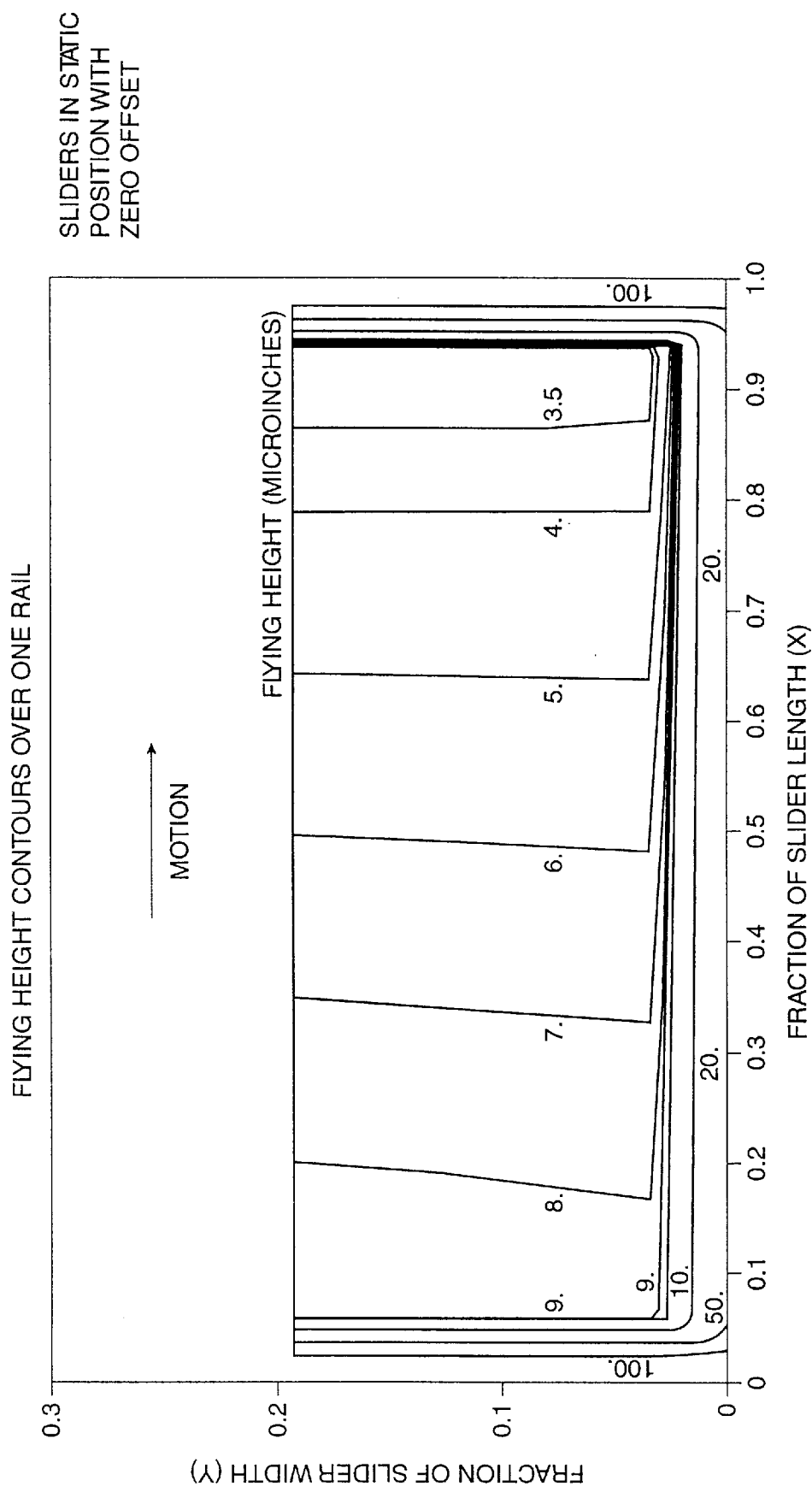
FIG. 39 illustrates flying height contour plots over the full inside rail of the lower slider (side 0 of FIG. 36) having zero off-set and static (zero access) flying conditions.
Figure 40:
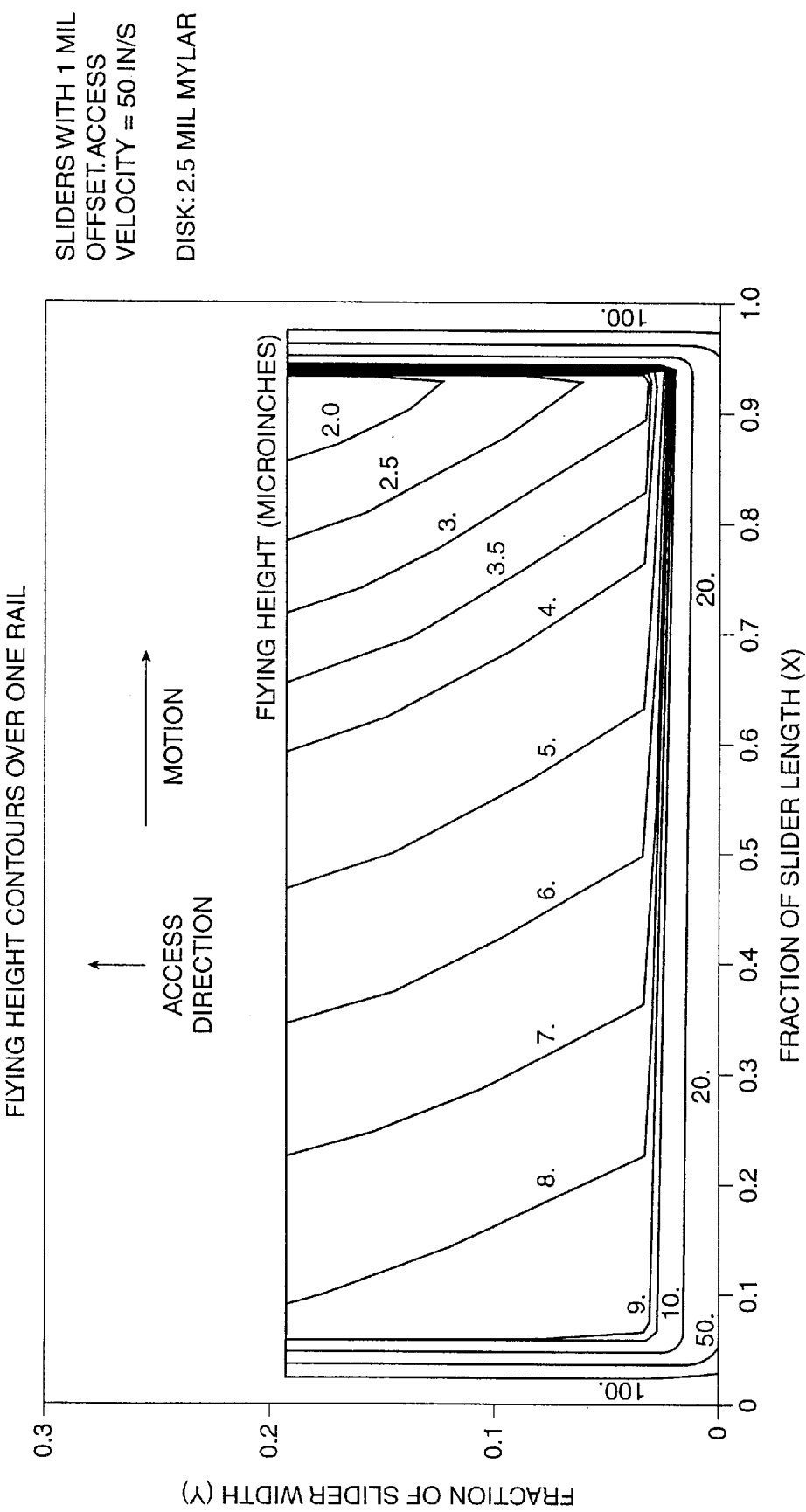
FIG. 40 illustrates flying height contours over the rail of FIG. 36 for the case of one mil transverse mounting off-set between the opposed sliders and an access speed of 50. in/s for the pair of sliders at a radius of 0.9 inch and toward the disk outer edge.

Flying height contour plots over the full inside rail 96 of the lower slider 90 (side 0 of FIG. 36) are shown in FIG. 39 for the case of zero off-set and static (zero access) flying conditions. The flying height is nearly symmetric in the transverse direction and decreases from the leading edge to trailing edge due to the positive pitch angle taken on by the slider relative to incoming airflow. The leading edge, trailing edge, and outer side edge of the rail are blended (rounded) to minimize wear when the slider starts and stops in contact with the disk surface. This blending explains the steep gradients of flying height along these edges. FIG. 40 presents flying height contours over the same rail for the case of one mil transverse mounting off-set between the opposed sliders and an access speed of 50. in/s for the pair of sliders at a radius of 0.9 inch and toward the disk outer edge. The combined effect of the slider off-set and access motion produces an asymmetry and reduced minimum clearance into the FH profile, as already shown in FIG. 38.

Figure 41:
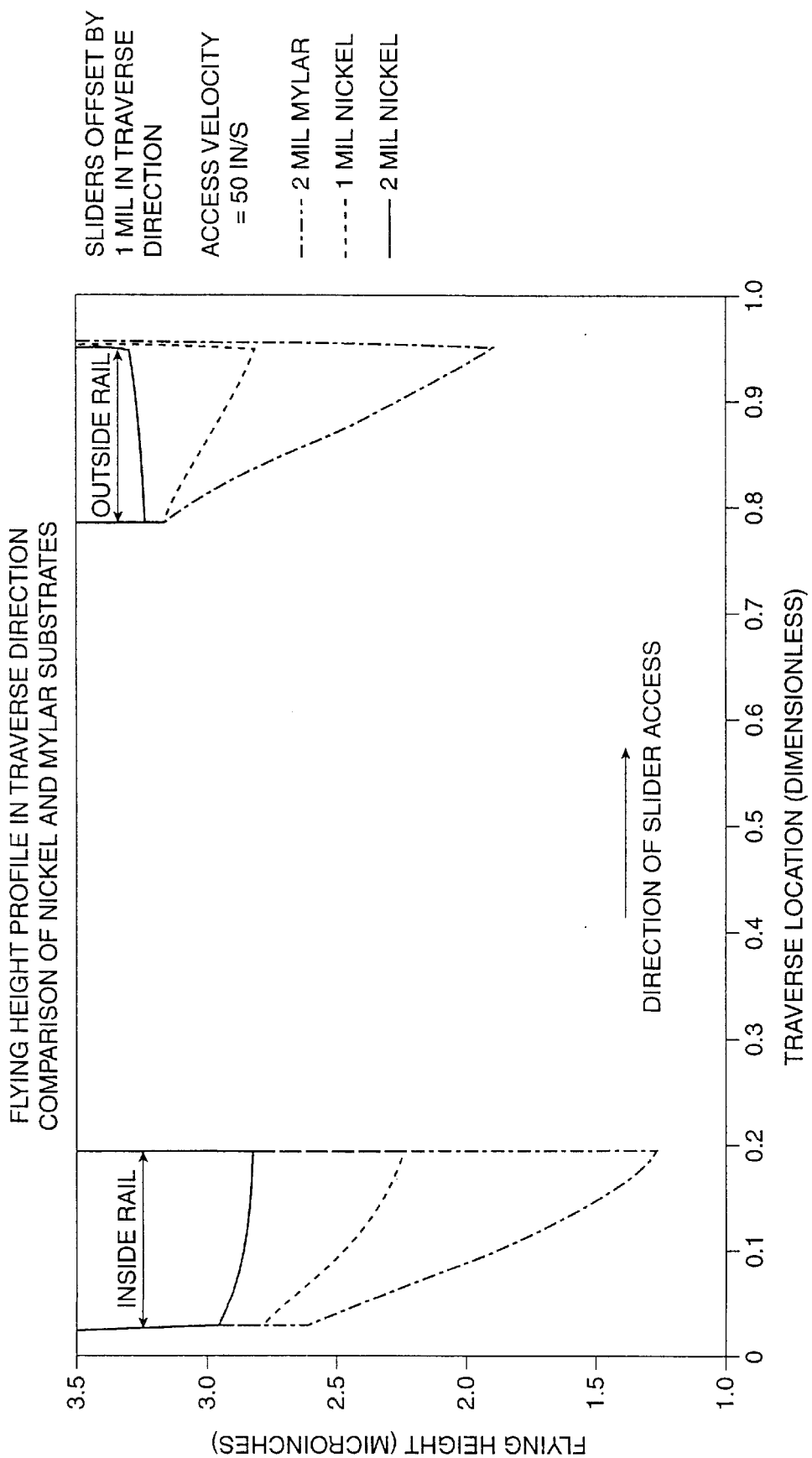
FIG. 41 illustrates transverse flying height profiles at the slider longitudinal location of absolute minimum flying height for one mil thick and two mils thick nickel foil disks, and for a two mils thick Mylar disk, all at an access speed of 50 in/s and slider off-set of one mil.

Next, consider a nickel foil disk. The increased elastic modulus of the nickel (approximately 31. million psi), versus that of aluminum (approximately 10. million psi), produces further improvement in flying height resistance to slider mounting (off-set) error and access motion. Transverse flying height profiles at the slider longitudinal location of absolute minimum flying height are presented on FIG. 41 for one mil thick and two mils thick nickel foil disks, and for a two mils thick Mylar disk. The minimum FH is 2.82 microinches for the two mils thick nickel disk and 2.25 microinches for the one-mil thick nickel disk. The minimum FH for the two mils thick Mylar disk is 1.26 microinches. The sensitivity of flying height to access motion and slider off-set mounting for the nickel foil disk is substantially less than that of the Mylar disk, for the same value of disk thickness. This is due to the increased disk stiffness, which is provided by an increased modulus of elasticity.

Application of this invention is not limited by the size of the metal foil disk diameter. The invention is applicable for data storage on either two sides of the metal foil disk, or on only one side of the metal foil disk. The invention is applicable for use in rotating memory devices utilizing either a removable storage medium or a non-removable storage medium. It is applicable for all disk rotational speeds above 2000 rpm. The invention can be used with any type of magnetic head transducer, including without limit: ferrite heads, metal-in-gap heads, thin film inductive heads, magnetoresistive heads, and planar thin film heads. The invention is applicable for use with all slider sizes, including without limitation: 100%, 70%, 50%, 30%, and 25% industry standard sizes. The invention can be applied with any type of slider air bearing surface, including without limitation: portions of the air bearing surface which contain straight rails, shaped rails, full and partial length rails, transverse pressure contours, and vacuum cavities. This invention, as described, provides advantages when used in conjunction with magnetic head sliders that operate nominally in a non-contact position. This invention also provides advantages when used with magnetic head sliders that utilize a partial contact condition during nominal operation. In that case, the magnetic transducer slides in contact with the recording surface, and the slider air-bearing surface provides non-contact support for the rest of the slider. While the invention has been described throughout this disclosure using air as the fluid bearing medium, another gas, such as helium, could also be used.

In summary, the metal foil disk of the invention when used in conjunction with opposed recording head air bearing sliders provides important advantages over other recording technologies. In particular, the high areal storage densities realized with the HD are possible with the metal foil disk, because both disk technologies utilize a high temperature sputtered magnetic film and an isotropic substrate. Further, the metal foil disk is cheaper to manufacture than the HD because of decreased material costs and process advantages. The head/disk interface created by the metal foil disk is more shock resistant than that of the HD. Still further, the metal foil disk provides areal densities that far exceed those possible with Mylar substrate disks. This is due to the anisotropic and temperature limited nature of Mylar. Finally, the head/disk interface created by the metal foil disk is less susceptible to contact/impact during high speed track-to-track access than that of a Mylar floppy disk.

The invention has now been described in detail. However, it will be appreciated that certain changes and modifications may be made. Therefore, the scope and content of this invention are not limited by the foregoing description. Rather, the scope and content are to be defined by the following claims.

What is claimed is:

1. A recording medium comprising:
   a metallic substrate; and
   at least one sputter deposited film of magnetic material;
   wherein the recording medium has a thickness that is less than about 0.005 inch, wherein the substrate occupies at least 80% of the thickness, wherein the sputter deposited film is adapted to record and reproduce high areal densities of digital data, wherein the recording medium is adapted to be rotated between opposing air bearing sliders, with air films developing between the recording medium and the sliders during rotation, wherein the recording medium has a mass such that when a mechanical shock is applied to the recording medium or the sliders, the resulting motion of the recording medium is influenced by the air films between the recording medium and the sliders to resist impact between the recording medium and the sliders, and wherein the recording medium has a stiffness sufficient to make the recording medium resistant to flexing due to high speed slider access motion such that the recording medium and sliders resist impacting each other during high speed slider access motion.

2. A recording medium as in claim 1, wherein the substrate is selected from the group of substrates consisting of nickel, nickel alloys, steel, stainless steel, Sandvik steel, beryllium, beryllium alloys, copper, copper alloys, brass, bronze, titanium, titanium alloys, aluminum, and aluminum alloys.

3. A recording medium as in claim 1, wherein the thickness of the recording medium is less than about 0.002 inch.

4. A recording medium as in claim 1, wherein the thickness of the recording medium is in the range from about 0.0001 inch to about 0.005 inch.

5. A recording medium as in claim 1, further comprising a layer at least primarily of chromium deposited between the substrate and the layer of magnetic film.

6. A recording medium as in claim 1, further comprising a layer of platinum or platinum alloys deposited between the substrate and the layer of magnetic film.

7. A recording medium as in claim 1, wherein the magnetic film comprises cobalt.

8. A recording medium as in claim 1, further comprising a layer of protective film deposited on the layer of magnetic film.

9. A recording medium as in claim 8, wherein the layer of protective film comprises carbon.

10. A recording medium consisting essentially of:
    a metallic substrate;
    a film of magnetic material;
    a layer at least primarily of chromium deposited between the metallic substrate and film of magnetic material; and
    a layer of protective film deposited on the film of magnetic material;
    wherein the recording medium has a thickness that is less than about 0.005 inch, wherein the substrate occupies at least 80% of the thickness, and wherein the recording medium is adapted to be positioned between opposing air bearing sliders such that the recording medium flexes to attain an equilibrium operating position between the opposing sliders during rotation of the recording medium.

11. A recording medium as in claim 10, wherein the film of magnetic material comprises cobalt.

12. A recording medium as in claim 10, wherein the layer of protective film comprises carbon.

13. A method for making a recording medium, comprising:
    providing a metallic substrate having a thickness that is less than about 0.005 inch;
    sputter depositing a layer of a magnetic material on the metallic substrate or on an intermediate material which is on the metallic substrate; and
    sputter depositing a protective film over the layer of magnetic material, wherein the total thickness of the medium is less than about 0.007 inch.

14. A method as in claim 13, wherein the intermediate material comprises a sputter deposited metallic layer which is deposited on the substrate prior to depositing the film of magnetic material.

15. A method as in claim 13, wherein the substrate is selected from the group of substrates consisting of nickel, nickel alloys, steel, stainless steel, Sandvik steel, beryllium, beryllium alloys, copper, copper alloys, brass, bronze, titanium, titanium alloys, aluminum, and aluminum alloys.

16. A system for reading and recording digital information, the system comprising:
    a metallic disk having a first side and a second side, the disk comprising a metallic substrate and at least one sputter deposited film of magnetic material, wherein the disk has a thickness that is less than about 0.010 inch, wherein the substrate occupies at least 80% of the thickness, and wherein the sputter deposited film is adapted to record and reproduce high areal densities of digital data;
    a first slider having a gas bearing surface positioned toward the first side of the disk;
    a second slider having a gas bearing surface positioned toward the second side of the disk, wherein at least one of the sliders houses at least one read and/or write transducer; and
    a mounting system to mount the second slider relative to the disk substantially opposite of the first slider and for urging the second slider toward the disk such that the second slider is movable toward and away from the disk;
    wherein the disk has a mass such that when a mechanical shock is applied to the disk or sliders, the resulting motion of the disk is influenced by air films between the disk and the sliders to resist impact between the disk and the sliders.

17. A system as in claim 16, wherein the metallic substrate is disposed between two sputter deposited films of a magnetic material.

18. A system as in claim 16, wherein the mounting system further rigidly mounts the first slider to prevent movement of the first slider relative to the disk.

19. A system as in claim 16, wherein the mounting system further mounts the first slider relative to the disk substantially opposite of the second slider and urges the first slider toward the disk, such that the first slider is movable toward and way from the disk.

20. A system as in claim 16, wherein the mounting system further provides at least one rotational degree of freedom to the first slider relative to the plane of the disk.

21. A system as in claim 20, wherein the degree of freedom is a pitch degree of freedom.

22. A system as in claim 20, wherein the degree of freedom is a roll degree of freedom.

23. A system as in claim 10, wherein the mounting system provides at least one rotational degree of freedom to the second slider relative to the plane of the disk.

24. A system as in claim 23, wherein the degree of freedom is a pitch degree of freedom.

25. A system as in claim 23, wherein the degree of freedom is a roll degree of freedom.

26. A system as in claim 16, wherein the substrate is selected from the group of substrates consisting of nickel, nickel alloys, steel, stainless steel, Sandvik steel, beryllium, beryllium alloys, copper, copper alloys, brass, bronze, titanium, titanium alloys, aluminum, and aluminum alloys.

27. A system as in claim 16, wherein the thickness of the flexible metal disk is less than about 0.005 inches.

28. A system as in claim 16, wherein the thickness of the flexible metal disk is less than about 0.002 inch.

29. A system as in claim 16, wherein the thickness of the substrate is in the range from about 0.0001 inch to about 0.010 inch.

30. A system as in claim 16, further comprising a layer at least primarily of chromium deposited between the substrate and the layer of magnetic film.

31. A system as in claim 16, further comprising a layer at least primarily of platinum or platinum alloys deposited between the substrate and the layer of magnetic film.

32. A system as in claim 16, wherein the magnetic film comprises cobalt.

33. A system as in claim 16, further comprising a layer of protective film deposited on the layer of magnetic film.

34. A system as in claim 33, wherein the layer of protective film comprises carbon.

35. A system for reading and recording digital information, the system comprising:
a metallic disk having a first side and a second side, the disk comprising a metallic substrate located between two sputter deposited films of magnetic material, wherein the disk has a thickness that is less than about 0.010 inch, wherein the substrate occupies at least 80% of the thickness, and wherein the sputter deposited film is adapted to record and reproduce high areal densities of digital data;
a first slider having a gas bearing surface positioned toward the first side of the disk;
a second slider having a gas bearing surface positioned toward the second side of the disk, wherein at least one of the sliders houses at least one read and/or write transducer; and
a mounting system to mount the second slider relative to the disk substantially opposite of the first slider and for urging the second slider toward the disk such that the second slider is movable toward and away from the disk, and wherein the disk has a mass such that when a mechanical shock is applied to system, the resulting motion of the disk is influenced by air films between the disk and the sliders such that the first and the second sliders resist impacting the disk and wherein the disk has a stiffness sufficient to make the disk resistant to flexing when exposed to high speed track-to-track access motion to resist impact between the sliders and the disk.

36. A system for reading and recording digital information, the system comprising:
a metallic disk having a first side and a second side, the disk comprising a metallic substrate located between two sputter deposited films of magnetic material, wherein the disk has a thickness that is less than about 0.010 inch, wherein the substrate occupies at least 80% of the thickness, and wherein the sputter deposited film is adapted to record and reproduce high areal densities of digital data;
a first slider having a gas bearing surface positioned toward the first side of the disk;
a second slider having a gas bearing surface positioned toward the second side of the disk, wherein at least one of the sliders houses at least one read and/or write transducer; and
a mounting system to mount the first and the second sliders relative to the disk such that the first slider is substantially opposite of the second slider, wherein the mounting system urges the first slider toward the disk such that the first slider is movable toward and away from the disk, and wherein the mounting system urges the second slider toward the disk such that the second slider is movable toward and away from the disk, wherein the disk has a mass such that when a mechanical shock is applied to system, the resulting motion of the disk is influenced by air films between the disk and the sliders such that the first and the second sliders resist impacting the disk and wherein the disk has a stiffness sufficient to make the disk resistant to flexing when exposed to high speed track-to-track access motion to resist impact between the sliders and the disk.

37. A system as in claim 36, wherein the mounting system provides at least one rotational degree of freedom to the first slider relative to the plane of the disk.

38. A system as in claim 37, wherein the degree of freedom is a pitch degree of freedom.

39. A system as in claim 37, wherein the degree of freedom is a roll degree of freedom.

40. A system as in claim 36, wherein the mounting system provides at least one rotational degree of freedom to the second slider relative to the plane of the disk.

41. A system as in claim 40, wherein the degree of freedom is a pitch degree of freedom.

42. A system as in claim 40, wherein the degree of freedom is a roll degree of freedom.

43. A system for reading and recording digital information, the system comprising:
a metallic disk having a first side and a second side, the disk comprising a metallic substrate located between two sputter deposited films of magnetic material, wherein the disk has a thickness that is less than about 0.010 inch, wherein the substrate occupies at least 80% of the thickness, and wherein the sputter deposited film is adapted to record and reproduce high areal densities of digital data;
a first slider having a gas bearing surface positioned toward the first side of the disk;
a second slider having a gas bearing surface positioned toward the second side of the disk, wherein at least one of the sliders houses at least one read and/or write transducer; and
a mounting system to mount the first and the second sliders relative to the disk such that the first slider is substantially opposite of the second slider, wherein the mounting system provides at least one rotational degree of freedom to the first slider, and wherein the mounting system urges the second slider toward the disk such that the second slider is movable toward and away from the disk, wherein the disk has a mass such that when a mechanical shock is applied to system, the resulting motion of the disk is influenced by the air films between the disk and the sliders such that the first and the second sliders resist impacting the disk and wherein the disk has a stiffness sufficient to make the disk resistant to flexing when exposed to high speed track-to-track access motion to resist impact between the sliders and the disk.

44. A recording medium comprising:

a metallic substrate; and at least one sputter deposited film of magnetic material;

wherein the recording medium has a thickness that is less than about 0.010 inch, wherein the substrate occupies at least 80% of the thickness, wherein the sputter deposited film is adapted to record and reproduce high areal densities of digital data, wherein the recording medium is adapted to be rotated between opposing air bearing sliders, with air films developing between the recording medium and the sliders during rotation, and wherein the recording medium has a mass such that when a mechanical shock is applied to the recording medium or the sliders, the resulting motion of the recording medium is influenced by the air films between the recording medium and the sliders to resist impact between the recording medium and the sliders.

* * * * *